United States Patent
Miyashita et al.

(10) Patent No.: US 9,515,677 B2
(45) Date of Patent: Dec. 6, 2016

(54) DECODING METHOD, DECODING APPARATUS, AND COMPUTER-READABLE RECORDING MEDIUM

(71) Applicant: FUJITSU LIMITED, Kawasaki-shi, Kanagawa (JP)

(72) Inventors: Isao Miyashita, Shizuoka (JP); Masahiro Kataoka, Tama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/751,578

(22) Filed: Jun. 26, 2015

(65) Prior Publication Data

US 2016/0006455 A1 Jan. 7, 2016

(30) Foreign Application Priority Data

Jul. 7, 2014 (JP) ................. 2014-140059

(51) Int. Cl.
*H03M 7/34* (2006.01)
*H03M 7/30* (2006.01)
*H03M 7/42* (2006.01)

(52) U.S. Cl.
CPC ........... *H03M 7/3086* (2013.01); *H03M 7/425* (2013.01); *H03M 7/6005* (2013.01)

(58) Field of Classification Search
CPC ......... H03M 5/00; H03M 7/00; H03M 7/3086
USPC .................................... 341/50, 51
See application file for complete search history.

(56) References Cited

U.S. PATENT DOCUMENTS

| 5,841,953 A * | 11/1998 | Rohatgi | H03M 7/425 358/1.15 |
| 6,693,567 B2 * | 2/2004 | Cockburn | H03M 7/3086 341/50 |
| 8,429,196 B2 * | 4/2013 | Chandrasekar | G06F 17/30923 707/797 |
| 8,601,368 B2 * | 12/2013 | Fablet | G06F 17/2247 715/234 |
| 2002/0038320 A1 * | 3/2002 | Brook | G06F 17/2247 715/237 |
| 2003/0005001 A1 | 1/2003 | Kataoka | |

FOREIGN PATENT DOCUMENTS

JP 2003-30030 1/2003

* cited by examiner

*Primary Examiner* — Jean B Jeanglaude
(74) *Attorney, Agent, or Firm* — Oblon, McClelland, Maier & Neustadt, L.L.P.

(57) ABSTRACT

A decoding method includes: decoding first coded data included in a coded data into first partial data, the coded data being encoded from first data with a first character code, by a processor; detecting character boundary in the first partial data based on character code information that the coded data is encoded from the first data with the first character code, by the processor; and converting at least a part of the first partial data into second data with a second character code utilizing the detected character boundary, based on information associating the first character code with the second character code, by the processor.

14 Claims, 27 Drawing Sheets

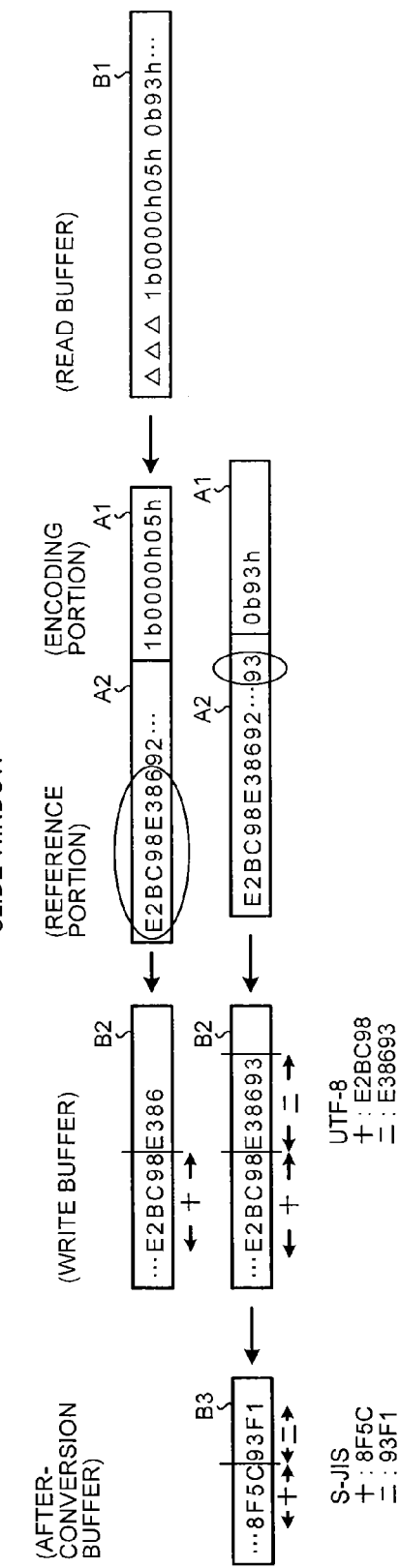

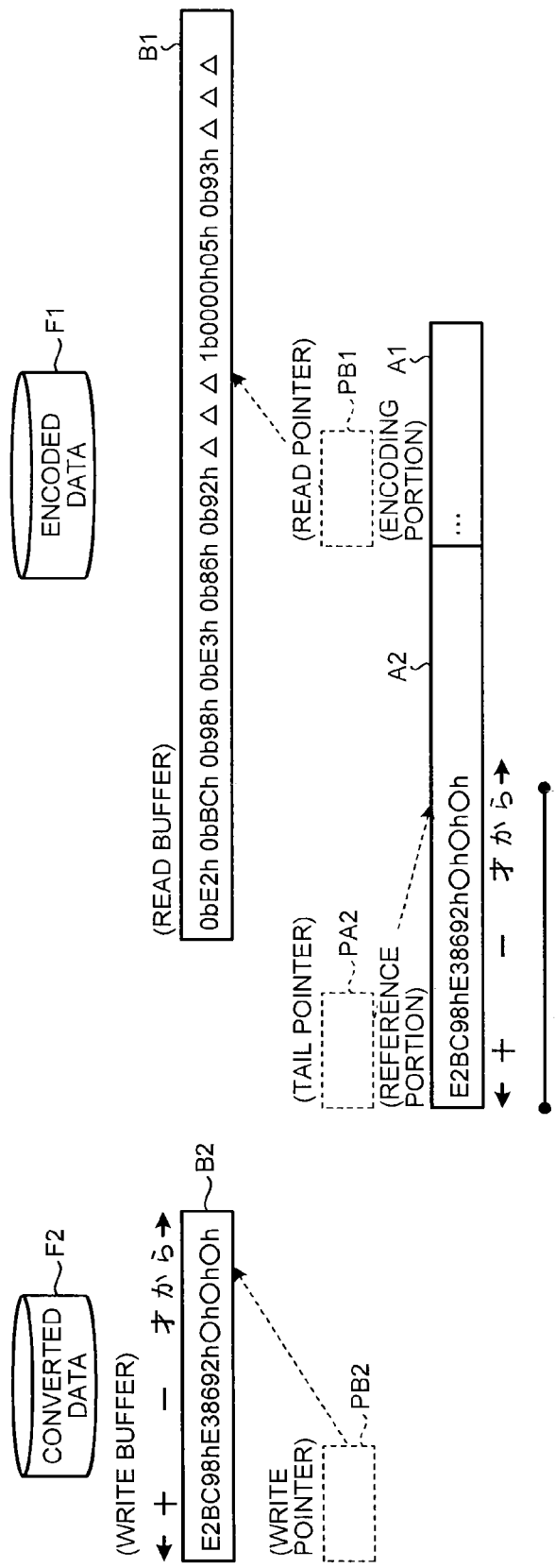

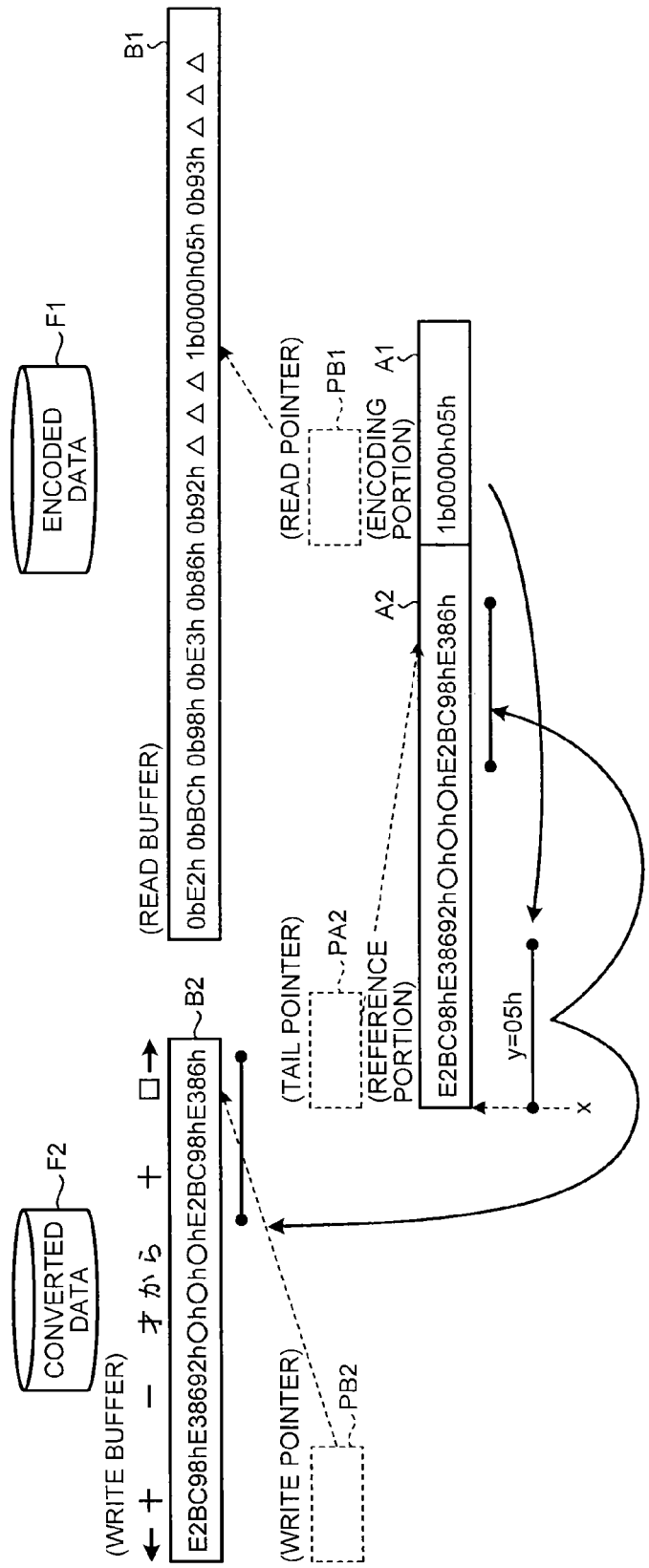

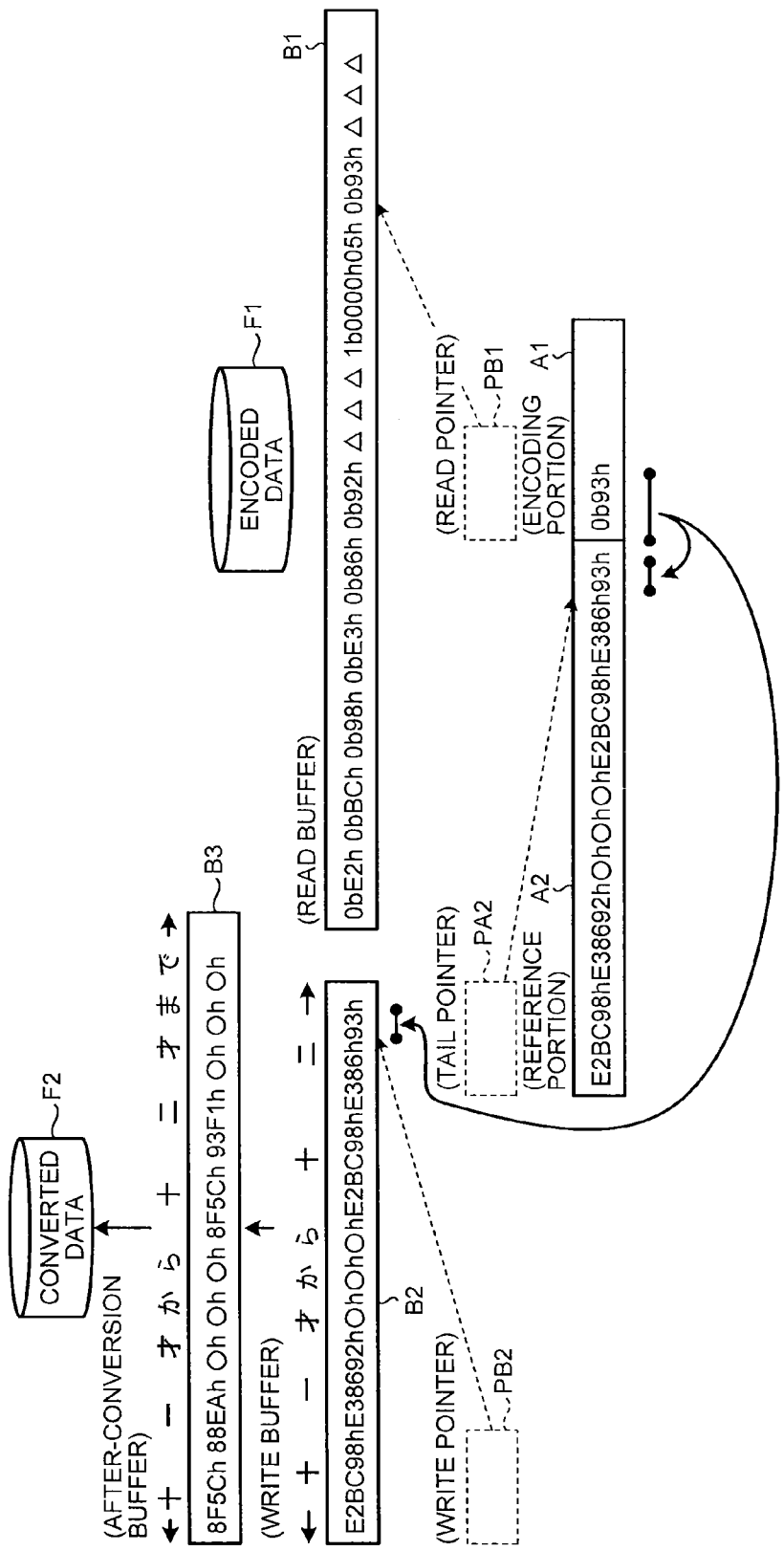

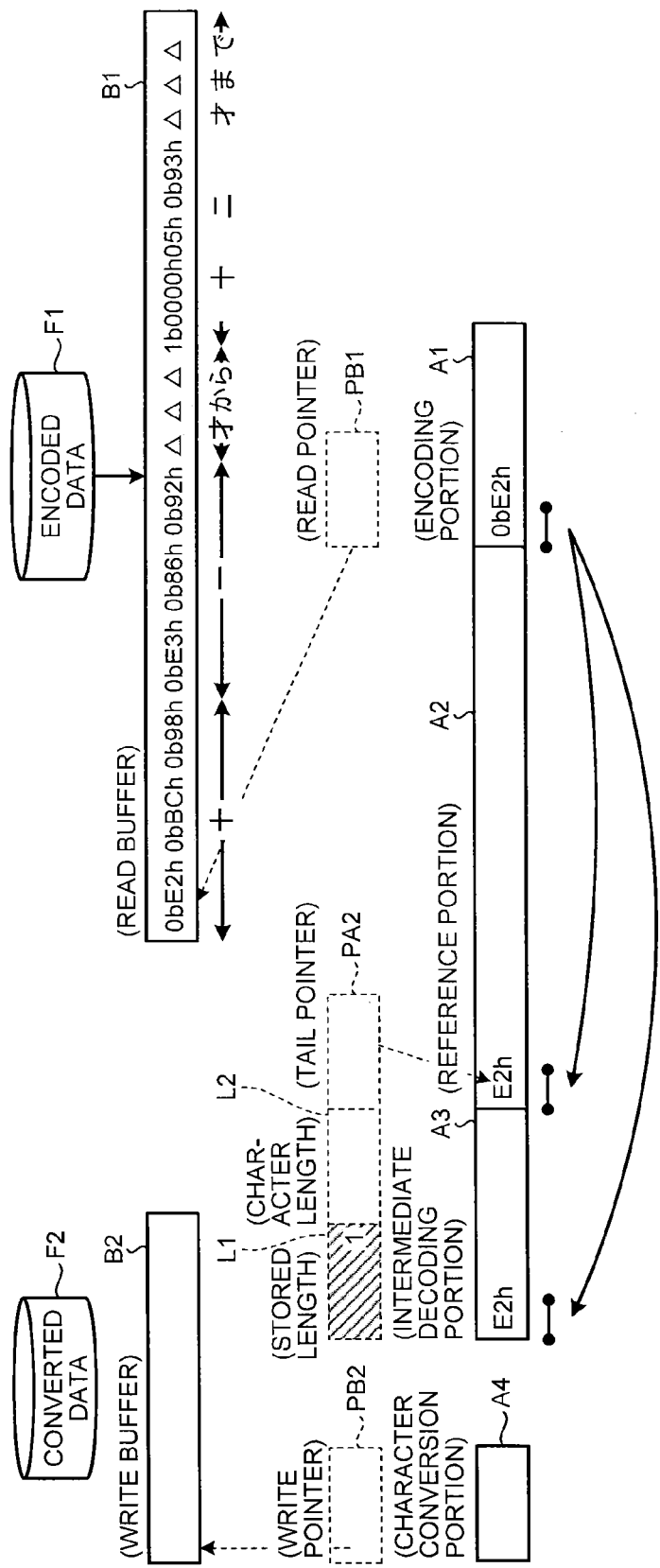

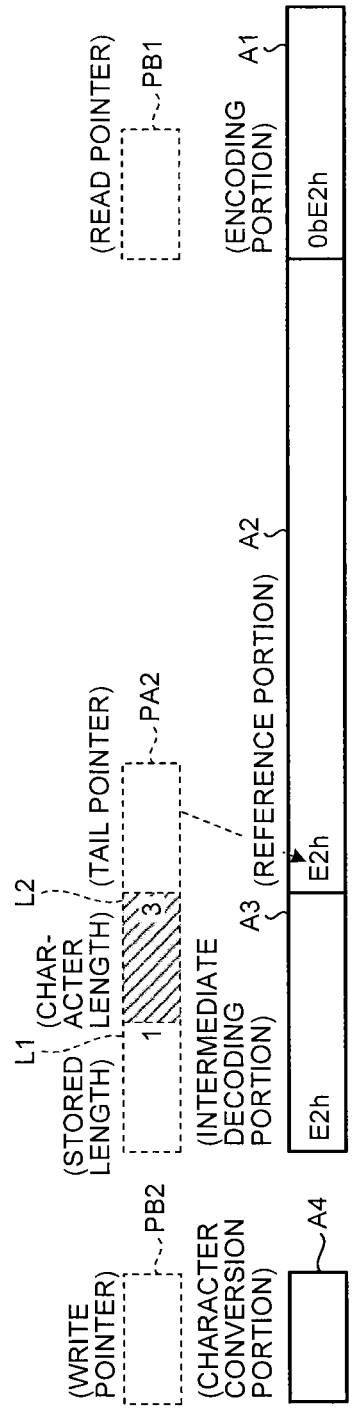

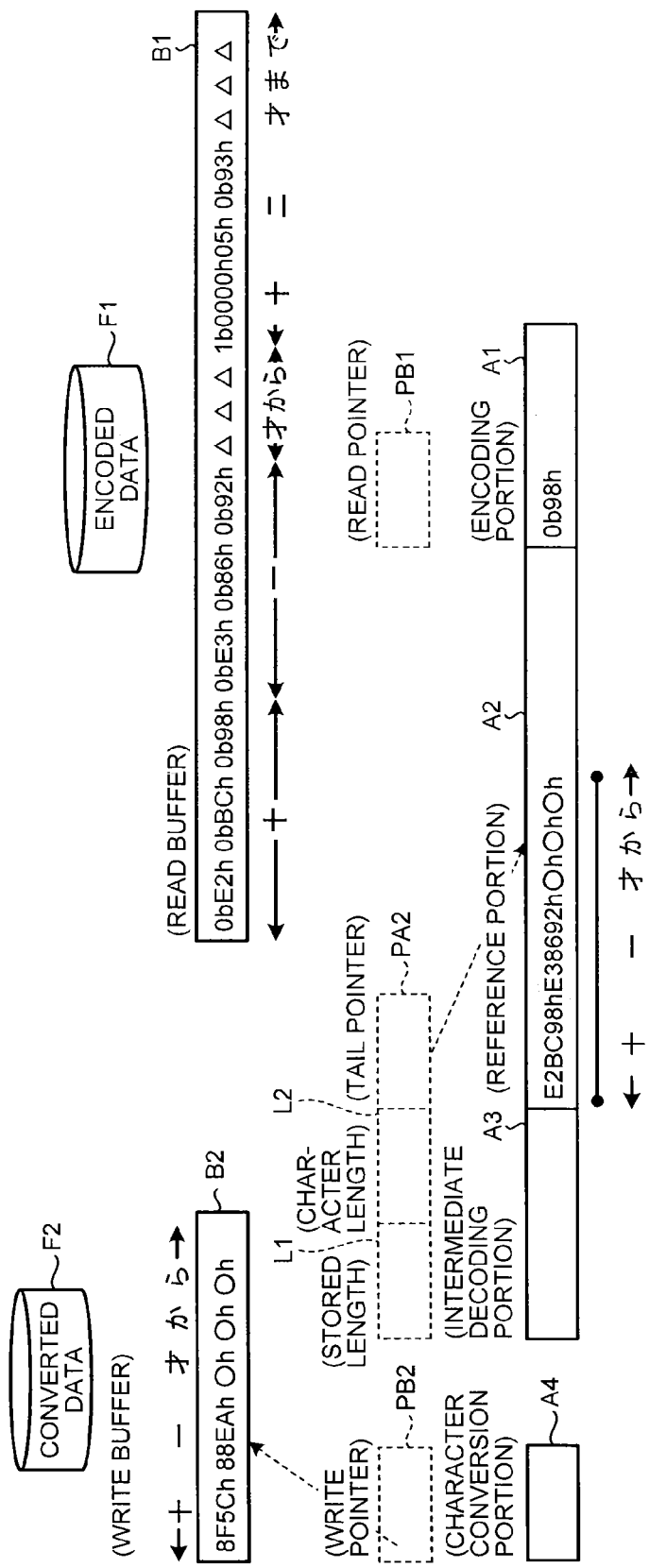

DECODING METHOD, DECODING APPARATUS, AND COMPUTER-READABLE RECORDING MEDIUM

CROSS-REFERENCE TO RELATED APPLICATION

This application is based upon and claims the benefit of priority of the prior Japanese Patent Application No. 2014-140059, filed on Jul. 7, 2014, the entire contents of which are incorporated herein by reference.

FIELD

The embodiments discussed herein are related to a decoding method, a decoding apparatus, and a computer-readable recording medium.

BACKGROUND

When encoded data need to be subjected to character code conversion, the character code conversion is generally implemented in two passes, in the order of decoding processing and character code conversion processing (see, for example, Japanese Laid-open Patent Publication No. 2003-30030). Therefore, a storage area for storing a result of the decoding processing needs to be prepared.

ZIP using LZ77 is the mainstream of encoding and decoding algorithms. With ZIP, for a character string to be encoded, a longest matching character string is determined by using a slide window to generate encoded data. For encoded data to be decoded, a longest matching character string is determined by using a slide window to generate decoded data. The determination of longest match character strings by using slide windows is performed byte by byte.

However, there is a problem that when code conversion of the encoded data is performed character by character after the decoding processing, because byte lengths in the decoding processing of the encoded data and in the character code conversion processing are different from each other, these processes need to be executed separately. Thus, for example, there is problem that waste is generated in the storage area. From another point of view, there is a problem that the processing time becomes long.

For example, for ZIP, in the encoding processing and decoding processing, while the determination of the longest match is performed byte by byte, the character code conversion processing is performed character by character. A length of a character in a character code system, such as UTF-8, which includes CJK characters, is known to be either of one to four bytes. That is, while there are characters each expressed by one byte (for example, alphanumeric characters), characters each expressed by three bytes (for example, some of Level-1 kanjis, and Level-2 kanjis and kana characters) and characters each expressed by four bytes (for example, some of Level-3 and Level-4 kanjis) are also present. Therefore, by the longest matching of the decoding processing, the decoded data generated byte by byte are in units different from byte units of these characters. Accordingly, the decoded data are unable to be directly handed over to the character code conversion processing in which the characters are directly treated as units, and the decoding and the character code conversion are unable to be executed in one pass. As a result, in the decoding processing, the result of decoding of the entire encoded data needs to be stored in the storage area and waste in the storage area is generated.

Further, the processing time for the decoding processing and character code conversion processing becomes too long.

The problem that the decoding processing of the encoded data and the character code conversion processing need to be performed as separate processes will be described with reference to FIG. 1A and FIG. 1B. FIG. 1A is a diagram illustrating a decoding and conversion process using the LZ77 system. As illustrated in FIG. 1A, in decoding processing, all of encoded data are decoded, and all of the decoded data that have been decoded are stored into a storage area. In character code conversion processing, character codes of all of the decoded data stored in the storage area are converted to generate converted data.

FIG. 1B is another diagram illustrating the decoding and conversion process using the LZ77 system. With reference to FIG. 1B, a case where encoded data in UTF-8 character codes are decoded will be described. As illustrated in FIG. 1B, each of storage areas A1, A2, B1, and B2 is secured in a memory, for example. The storage area B1 is called "read buffer", for example. In the decoding processing, encoded data stored in the storage area B1 are decoded by performing longest match determination with the storage areas A1 and A2 corresponding to slide windows. The storage area A1 is called "encoding portion", for example. The storage area A2 is called "reference portion", for example. In the decoding processing, the decoded data that have been decoded are directly written into the storage areas A2 and B2. The storage area B2 is called "write buffer", for example.

For example, in first longest matching of the decoding processing, the encoded data stored in the storage area B1 are decoded by using the storage areas A1 and A2. That is, since the decoding processing is performed byte by byte, ends of characters in the decoded data that have been decoded are not recognized. In the decoding processing, the decoded data that have been decoded are directly written into the storage areas A2 and B2. In the example of FIG. 1B, the decoded data that have been decoded in the first longest matching are "E2BC98E386". In this case, the data written into the storage area B2 are the decoded data as is, "E2BC98E386". This "E2BC98E386" consists of "十" (0xE2BC98) (a Japanese character meaning, "ten"), and "☐" (0xE386), which is not up to an end of a character. That is, "parting in tears", which means being off from a boundary between character codes, has been caused. When data of a second longest match, "93", are written into the storage area B2, "二" (0xE38693) (a Japanese character meaning, "two"), which is up to the end of the character, is generated. Accordingly, while the decoding processing is performed byte by byte, the character code conversion processing is performed character by character, and thus the decoded data obtained by the decoding processing are not able to be directly subjected to the character code conversion. Therefore, in the decoding processing using the LZ77 system, after decoding of the entire decoded data is performed, character code conversion is conducted for the decoded data that have been decoded, and thus a storage area B3 for a result of the character code conversion is needed and waste is generated in the storage area A2 used in the decoding process. Further, the processing time for the decoding processing and character code conversion processing becomes long.

SUMMARY

According to an aspect of the embodiments, a decoding method includes: decoding first coded data included in a coded data into first partial data, the coded data being encoded from first data with a first character code, by a processor; detecting character boundary in the first partial data based on character code information that the coded data is encoded from the first data with the first character code, by the processor; and converting at least a part of the first partial data into second data with a second character code utilizing the detected character boundary, based on information associating the first character code with the second character code, by the processor.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1B is another diagram illustrating the decoding and conversion process using the LZ77 system;

FIG. 2D is still another diagram illustrating the example of decoding processing using the LZ77 system;

FIG. 2E is yet another diagram illustrating the example of decoding processing using the LZ77 system;

FIG. 2F is still another diagram illustrating the example of decoding processing using the LZ77 system;

FIG. 4A is a diagram illustrating an example of the decoding and conversion process according to the embodiment;

FIG. 4B is another diagram illustrating the example of the decoding and conversion process according to the embodiment;

FIG. 4G is yet another diagram illustrating the example of the decoding and conversion process according to the embodiment;

DESCRIPTION OF EMBODIMENTS

Preferred embodiments will be explained with reference to accompanying drawings. This invention is not limited by these embodiments.

First, decoding processing using the LZ77 system will be described.

Example of Decoding Processing According to Reference Example Using LZ77 System

Figure 2A:
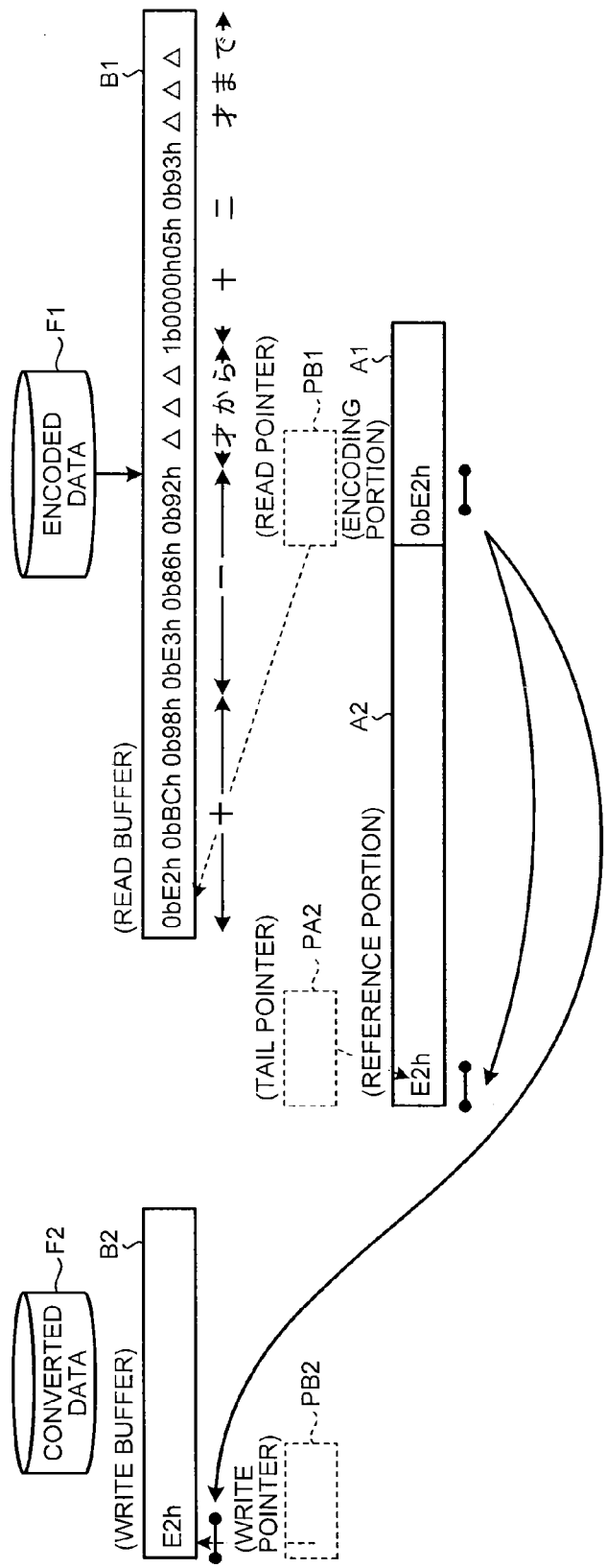
FIG. 2A is a diagram illustrating an example of decoding processing using the LZ77 system.

FIG. 2A to FIG. 2F are diagrams illustrating an example of the decoding processing using the LZ77 system. As illustrated in FIG. 2A, each of storage areas A1, A2, B1, and B2 is secured in a memory. The storage areas A1 and A2 correspond to slide windows, and are called, for example, "encoding portion" and "reference portion". The storage areas B1 and B2 are called, for example, "read buffer" and "write buffer". Further, each of pointers PB1, PB2, and PA2 is set in the memory. Encoded data of a content portion in a file F1 are read into the storage area B1. In the read buffer B1, encoded data are included, which have been obtained by encoding, by the LZ system, character codes in UTF-8 for a character string to be processed, "十一才から十二才まで" (Japanese characters meaning, "from eleven-year-olds to twelve-year-olds"). The "ΔΔΔ" included in the read buffer B1 is assumed to be encoded data of a character string, "才から" (Japanese characters meaning, "from . . . year-olds").

In encoding processing not illustrated, for character codes of the character string to be processed, data that match the longest with character codes that have been processed already (longest matching data) are searched for. The character codes that have been processed already are stored in the storage area A2. If the longest matching data are less than three bytes, each character is generated as encoded data byte by byte. A head of the encoded data includes an identifier (for example, "0"), which indicates that the encoded data are not based on the longest matching data. Herein, "0bE2h", "0bBCh", "0b98h", and the like in the storage area B1 are encoded data including the identifier indicating that the encoded data are not based on the longest matching data. Further, the character codes themselves being used as a part of the encoded data is just an example, and Huffman codes obtained by encoding by the Huffman encoding/decoding algorithm may be used, or another encoding algorithm may be used.

On the contrary, if longest matching data equal to or more than three bytes are retrieved, encoded data are generated based on a position of the longest matching data in the storage area A2 and a data length of the longest matching data. A head of the encoded data includes an identifier (for example, "1"), which indicates that the encoded data are based on the longest matching data. Herein, "1b0000h05h" in the storage area A3 is encoded data including the identifier indicating that the encoded data are based on the longest matching data.

Under such circumstances, in the encoding processing, data of the content portion in the file F1 illustrated in FIG. 2A are read into the storage area B1. In the decoding processing, the encoded data read into the storage area B1 are sequentially read out into the storage area A1. The pointer PB1 is positional information (a read pointer) that indicates a position to be read out next in the storage area B1. Herein, the encoded data, "0bE2h", in the storage area B1 are read out into the storage area A1 via the pointer PB1. The read out encoded data are subjected to decoding processing according to the identifier included in the encoded data. In the decoding processing, if the identifier is the identifier ("0" in the example of FIGS. 2A to 2F) indicating that the encoded data are not based on the longest matching data, one character of the encoded data is decoded, and the decoded one character is stored into the storage area A2 and storage area B2. Herein, since the identifier is "0", the character code itself, "E2h" (0xE2), is stored into the storage area A2 and storage area B2. By the decoding processing, contents of the pointer PB1, the pointer PB2, and the pointer PA2 are updated. The pointer PA2 is positional information (a tail pointer) indicating a tall in the storage area A2. The pointer PB2 is positional information (a write pointer) indicating a position to be written into next in the storage area B2.

Figure 2B:
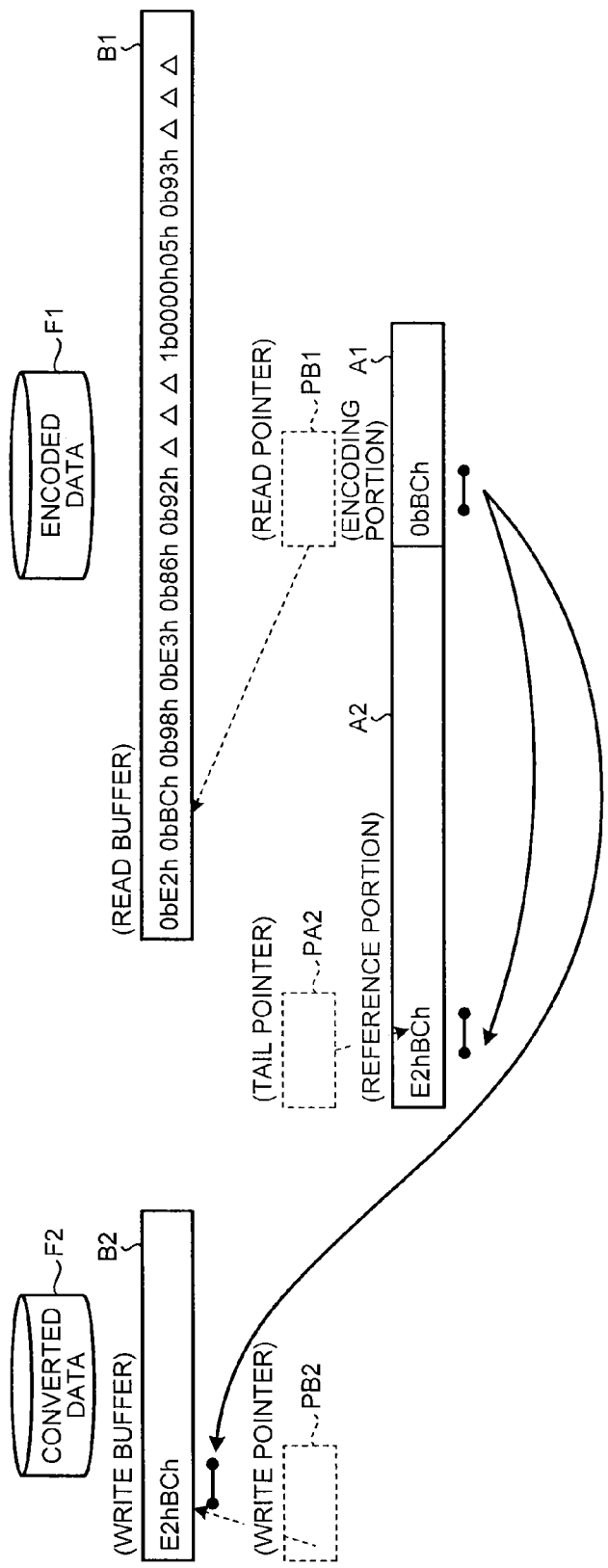
FIG. 2B is another diagram illustrating the example of decoding processing using the LZ77 system.

Next, as illustrated in FIG. 2B, in the decoding processing, the encoded data, "0bBCh", in the storage area B1 are read out into the storage area A1 via the pointer PB1. The read out encoded data are subjected to decoding processing according to the identifier included in the encoded data. Herein, since the identifier is "0", the character code itself, "BCh" (0xBC), is stored into the storage area A2 and storage area B2. By the decoding processing, contents of the pointer PB1, the pointer PB2, and the pointer PA2 are updated.

Figure 2C:
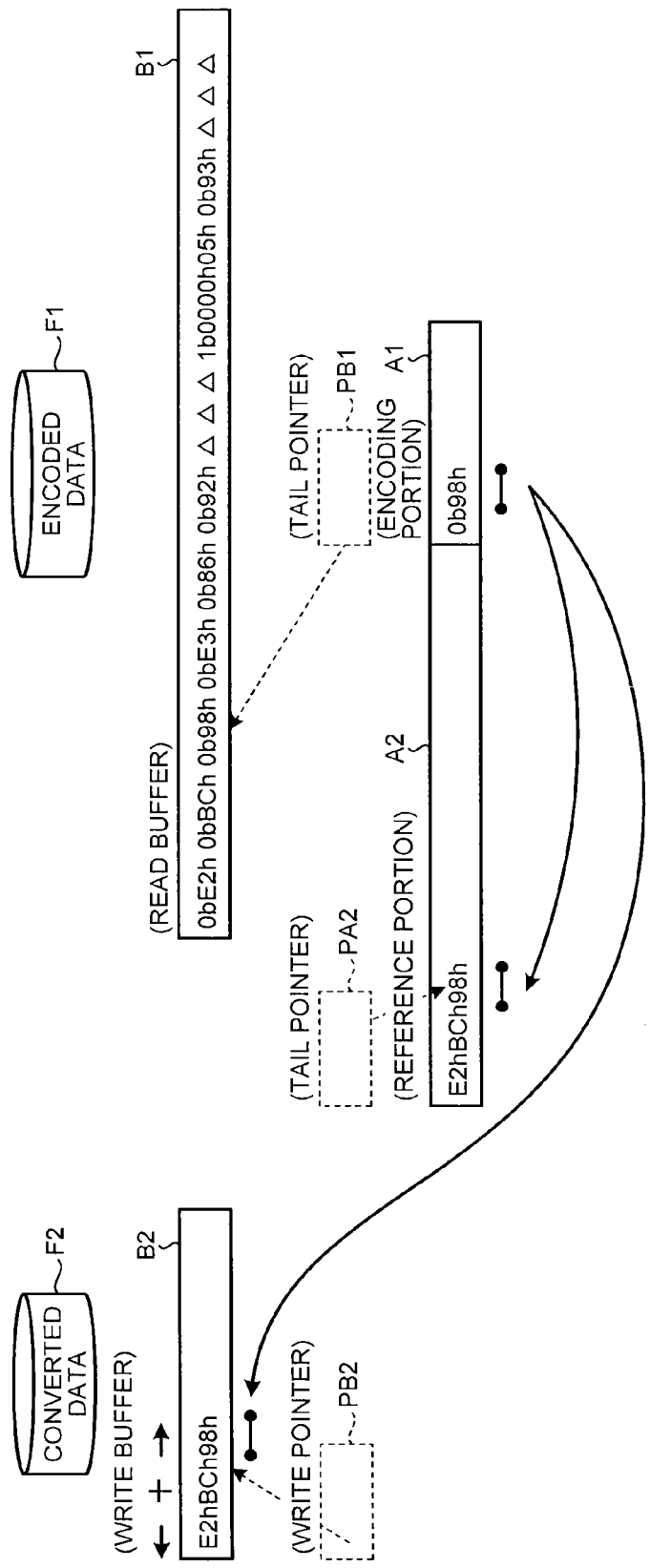
FIG. 2C is yet another diagram illustrating the example of decoding processing using the LZ77 system.

Next, as illustrated in FIG. 2C, in the decoding processing, the encoded data, "0b98h", in the storage area B1 are read out into the storage area A1 via the pointer PB1. The read out encoded data are subjected to decoding processing according to the identifier included in the encoded data. Herein, since the identifier is "0", the character code itself, "98h" (0x98), is stored into the storage area A2 and storage area B2. By the decoding processing, contents of the pointer PB1, the pointer PB2, and the pointer PA2 are updated.

Next, as illustrated in FIG. 2D, for the encoded data in the storage area B1, decoding processing is repeated to decode the encoded data corresponding to the character string, "十一才から" (Japanese characters meaning, "from eleven-year-olds"), into codes in UTF-8. In the storage area A1 and storage area A2, "E2BC98hE38692h$_i$O$_h$|O$_h$ O$_h$" is stored. The stored character codes are character codes corresponding to the character string, "十一才から".

Next, as illustrated in FIG. 2E, in the decoding processing, the encoded data, "1b0000h05h", in the storage area B1 are read out into the storage area A1 via the pointer PB1. The read out encoded data are subjected to decoding processing according to the identifier included in the encoded data. In the decoding processing, if the identifier is the identifier ("1" in the example of FIGS. 2A to 2F) indicating that the encoded data are based on the longest matching data, the longest matching character string is decoded based on the encoded data. In the decoding processing, the decoded character string is stored into the storage area A2 and storage area B2. Herein, since the identifier is "1", based on a data length and information on a position of the longest matching data included in the encoded data, a character code string is read out from the storage area A2. That is, based on the data length, "05h", and the information on the position, "0000h", of the longest matching data, the decoded character string "E2BC98hE386h" is read out. In the decoding processing, the read out character string, "E2BC98hE386h", is stored into the storage area A2 and storage area B2. By the decoding processing, contents of the pointer PB1, the pointer PB2, and the pointer PA2 are updated. As a result, since the "E386h" of the "E2BC98hE386h" stored in the storage area B2 is not up to an end of a character, "parting in tears" has been caused.

As illustrated in FIG. 2F, in the decoding processing, the encoded data, "0b93h", in the storage area B1 are read out into the storage area A1 via the pointer PB1. The read out encoded data are subjected to decoding processing according to the identifier included in the encoded data. Since the identifier is "0", the character code itself, "93h" (0x93), is stored into the storage area A2 and storage area B2. By the decoding processing, contents of the pointer PB1, the pointer PB2, and the pointer PA2 are updated. As a result, the "E38693h" in the storage area B2 is up to the end of the character and "parting in tears" is solved.

Thereafter, when all of the encoded data have been decoded, in the decoding processing, a character code string corresponding to one character is cut out from the character code string in UTF-8 stored in the storage area B2 and converted into a character code string of a character code system that has been specified beforehand. In the decoding processing, the converted character code string is stored into the storage area B3. The storage area B3 is, for example, an after-conversion buffer. A result of conversion from UTF-8 to Shift JIS is illustrated herein. In the decoding processing, a file F2 is generated based on the converted data in the storage area B3.

Accordingly, in the decoding processing according to the reference example using the LZ77 system, if a result of decoding encoded data is to be brought into a state of having been subjected to character code conversion, the storage area B2 for accumulating all of the result of the decoding and the storage area B3 for accumulating all of the result of the conversion are needed, and thus increase in the storage areas is expected. That is, by this decoding processing, the storage area B2 for accumulating all of the result of the decoding is requested and waste is generated in the storage area B2 used in the decoding processing. Further, since the I/O to/from the storage area B2 used in the decoding processing is generated, the processing time of the decoding processing including the character code conversion processing becomes longer.

Decoding and Conversion Process According to Embodiment

Figure 3A:
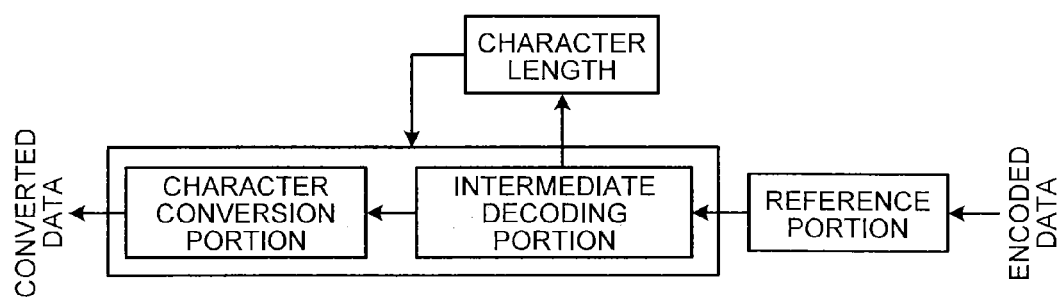
FIG. 3A is a first diagram illustrating a decoding and conversion process according to an embodiment.
Figure 3B:
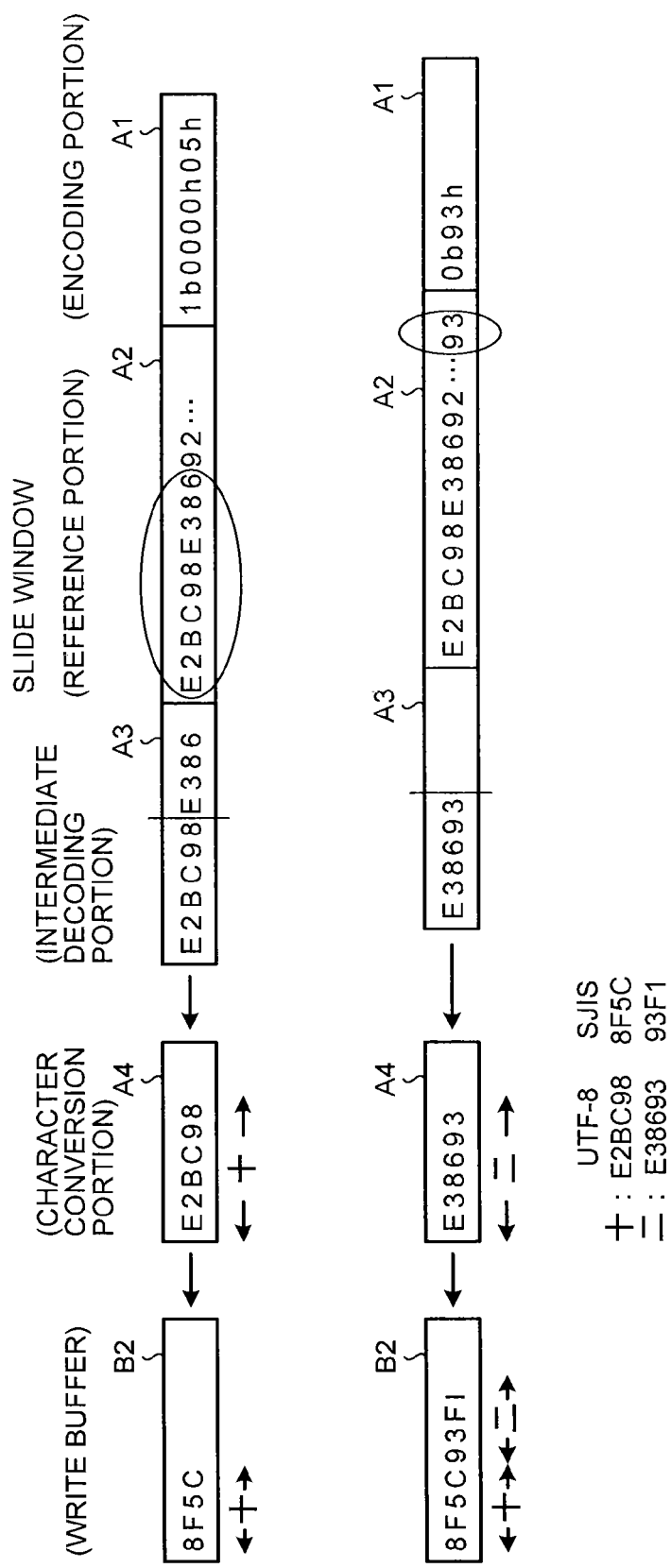
FIG. 3B is a second diagram illustrating the decoding and conversion process according to the embodiment.

FIG. 3A and FIG. 3B are diagrams illustrating a decoding and conversion process according to an embodiment. As illustrated in FIG. 3A, in the decoding and conversion process, for each set of encoded data, the set of encoded data is decoded by using a reference portion and the decoded data that have been decoded are accumulated in an intermediate decoding portion. In the decoding and conversion process, a character length is obtained based on a head byte of the decoded data accumulated in the intermediate decoding portion. In the decoding and conversion process, if the decoded data accumulated in the intermediate decoding portion becomes equal to or more than this character length, character codes of the decoded data corresponding to that character length from the head of the intermediate decoding portion are converted by using a character conversion portion to generate converted data. The decoded data obtained as a result of decoding the encoded data are an example of partial data.

Figure 1A:
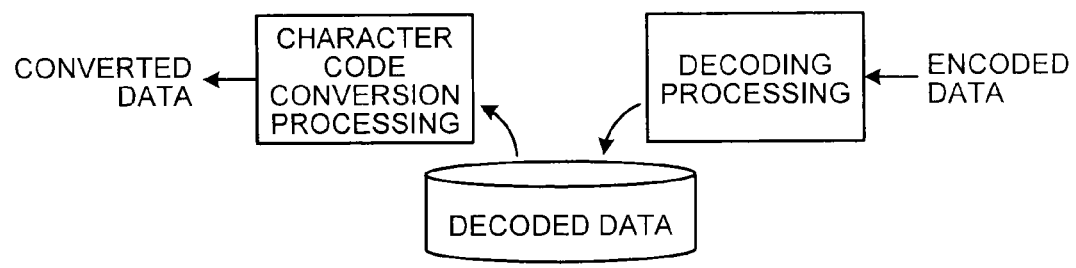
FIG. 1A is a diagram illustrating a decoding and conversion process using the LZ77 system.

As illustrated in FIG. 3B, each of storage areas A1 to A4, B1, and B2 is secured in a memory, for example. The storage areas A1 (for example, an encoding portion), A2 (for example, a reference portion), B1 (for example, a read buffer), and B2 (for example, a write buffer) have configurations that are the same as those in the decoding processing illustrated in FIG. 1B. In the decoding and conversion process, codes in a code string that has been encoded in a longest match format are decoded, by using the storage areas A1 and A2, into a data string representing a byte string of a particular group that becomes the longest match, and the decoded data string (decoded data) is stored into the storage area A3. The storage area A3 is called, for example, "intermediate decoding portion". In the decoding and conversion process, when a character of a first character coding is recognized in the data string accumulated in the storage area A3, a data string of the recognized character is converted into a data string of a second character coding.

For example, in the decoding and conversion process, when character codes in UTF-8 are to be decoded, the encoded data stored in the storage area B1 are decoded by using the storage areas A1 and A2 and the decoded data that have been decoded are stored into the storage area A2. In the decoding and conversion process, the decoded data that have been decoded are written into the storage area A3, instead of the storage area B2. In the decoding and conversion process, since decoding is conducted byte by byte, ends of characters of UTF-8 of the decoded data that have been decoded are not recognized.

In the decoding and conversion process, based on a head byte of the decoded data stored in the storage area A3, a length of a character code corresponding to one character is obtained as a character length. For example, if the head byte is "E2", the character length is three bytes. In the decoding and conversion process, whether or not the length of the decoded data stored in the storage area A3 is equal to or greater than the obtained character length is determined. In the decoding and conversion process, if it is determined that the length is equal to or greater than the obtained character length, an end of a character is detected in the decoded data stored in the storage area A3. In the decoding and conversion process, the decoded data corresponding to the character length stored in the storage area A3 are stored into a storage area A4. In the example of FIGS. 3A and 3B, the decoded data that have been antecedently decoded are "E2BC98E386". Since a length of the decoded data, "E2BC98E386", that have been stored in the storage area A3 is five and the head byte of the decoded data is "E2", the character length is three. Since the length (five) of the decoded data is equal to or greater than the character length (three), it is determined that the length is equal or greater than the character length. The "E2BC98" corresponding to the character length (three) stored in the storage area A3 is stored into the storage area A4. In this case, in the decoding and conversion process, an end of a character is recognized in the decoded data. That is, occurrence of "parting in tears", which means being kept off from a boundary between character codes, is suppressed.

In the decoding and conversion process, the decoded data stored in the storage area A4 are converted into a character code used at a transmission destination to be written into the storage area B2. The storage area B2 is called, for example, "write buffer". In the example of FIG. 3B, the "E2BC98" of UTF-8 stored in the storage area A4 is converted into "8F5C" of Shift JIS to be written into the storage area B2 as converted data.

Next, in the decoding and conversion process, the decoded data that have been decoded next are stored into the storage area A2. Herein, in the decoding and conversion process, since decoding is conducted byte by byte, ends of UTF-8 characters of the decoded data that have been decoded are not recognized. In the decoding and conversion process, the decoded data that have been decoded are written into the storage area A3.

In the decoding and conversion process, based on the head byte of the decoded data stored in the storage area A3, a character length thereof is obtained. For example, if the head byte is "E3", the character length is three bytes. In the decoding and conversion process, whether or not the length of the decoded data stored in the storage area A3 is equal to or greater than the obtained character length is determined. In the decoding and conversion process, if it is determined that the length is equal to or greater than the obtained character length, an end of a character is detected in the decoded data stored in the storage area A3. In the decoding and conversion process, the decoded data corresponding to the character length stored in the storage area A3 are stored into the storage area A4. In the example of FIG. 3B, the decoded data that have been decoded next is "93". Since a total of lengths of the remaining decoded data, "E386", stored in the storage area A4 and the decoded data, "93", that have been decoded next is three and the head byte of the decoded data is "E3", the character length is three. Since the length of the decoded data (three) is equal to or greater than the character length (three), the length is determined to be equal to or greater than the character length and "E38693" up to the character length is stored into the storage area A4. In this case, in the decoding and conversion process, the end of the character is recognized in the decoded data. That is, occurrence of "parting in tears", which means being kept off from a boundary between character codes, is suppressed.

In the decoding and conversion process, the decoded data stored in the storage area A4 are converted into a character code used at the transmission destination to be written into the storage area B2. In the example of FIG. 3B, the "E38693" of UTF-8 stored in the storage area A4 is converted to "93F1" of Shift JIS and written into the storage area B2 as converted data.

Accordingly, in the decoding and conversion process, decoding is conducted byte by byte, but an end of a character in the decoded data is identified, the decoded data up to the end of the character are subjected to character code conversion, and the converted data are stored into the storage area B2 (for example, a write buffer). Therefore, in the decoding and conversion process, a storage area for accumulating all of the decoded data does not need to be prepared and waste of the storage area used in the decoding processing is able to be eliminated. Further, since the decoding and conversion process is able to realize character code conversion processing without accumulating all of the decoded data into a storage area or reading the decoded data from the storage area, the processing time is able to be shortened.

Example of Decoding and Conversion Process According to Embodiment

Figure 4C:
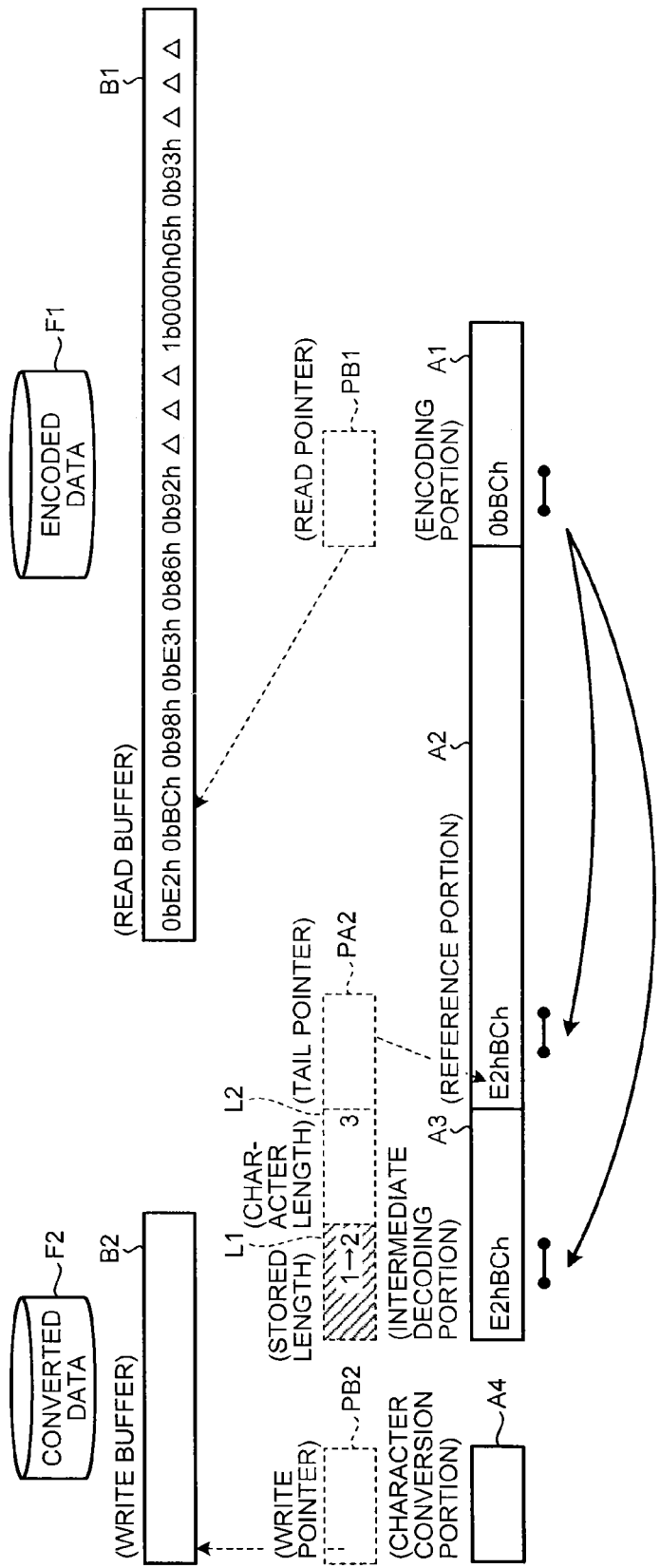
FIG. 4C is yet another diagram illustrating the example of the decoding and conversion process according to the embodiment.

FIG. 4A to 4L are diagrams illustrating an example of the decoding and conversion process according to the embodiment. As illustrated in FIG. 4A, each of the storage areas A1 to A4, B1, and B2 is secured in the memory. Further, each of the pointers PB1, PB2, and PA2 is set in the memory. The storage areas A1, A2, B1, and B2, and the pointers PB1, PB2, and PA2 have configurations that are the same as those in the decoding processing illustrated in FIG. 1B. The storage area A3 is called, for example, "intermediate decoding portion". The storage area A4 is called, for example, "character conversion portion". Encoded data of a content portion in the file F1 are read into the storage area B1. In the read buffer B1, encoded data are included, which have been obtained by encoding, by the LZ system, codes in UTF-8, for a character string to be processed, "十一才から 十二才まで". The "ΔΔΔ" included in the read buffer B1 is assumed to be encoded data of a character string, "才から". Further, the encoded data are assumed to be data of a format obtained by the above described search for the longest matching data.

Under such circumstances, in the decoding and conversion process, data of the content portion in the file F1 illustrated in FIG. 4A are read into the storage area B1. In the decoding and conversion process, the encoded data read into the storage area B1 are sequentially read out into the storage area A1. The pointer PB1 is a read pointer pointing a position to be read out in the encoded data in the storage area B1. In this case, the encoded data, "0bE2h", in the storage area A3 are read out into the storage area A1. In the decoding and conversion process, for the read out encoded data, decoding processing according to an identifier included in the encoded data is performed. In the decoding and conversion process, if the identifier is the identifier ("0" in the example of FIGS. 2A to 2F) indicating that the encoded data are not based on the longest matching data, one character of the encoded data is decoded, and the decoded one character is stored into the storage area A2 and storage area A3. Since the identifier is "0", the character code itself, "E2h" (0xE2), is stored into the storage area A2 and storage area A3. In the decoding and conversion process, a length of the stored character code is stored, as a stored length, into a primary area L1. In this case, in the primary area L1, "1", indicating that the stored length is one byte, is stored. By the decoding and conversion process, contents of the pointer PB1 and the pointer PA2 are then updated.

Next, as illustrated in FIG. 4B, in the decoding and conversion process, by using a head byte of the decoded data stored in the storage area A3, a length of a character code corresponding to one character is obtained as a character length. The character length, for example, is obtained based on a correspondence table storing therein correspondence between head bytes and character lengths. In the decoding and conversion process, the obtained character length is stored into a primary area L2. In this case, since the head byte is "E2", "3", indicating that the character length is three bytes, is stored into the primary area L2. In the decoding and conversion process, whether or not the length of the decoded data stored in the storage area A3 is equal to or greater than the obtained character length is determined. In the decoding and conversion process, if it is determined that the length is equal to or greater than the obtained character length, the decoded data up to the obtained character length are stored into the storage area A4. On the contrary, if the length is determined to be not equal to or greater than the obtained character length, the decoding and conversion process proceeds to the next decoding processing. In this case, since the length of the decoded data stored in the storage area A3 is "1" as stored in the primary area L1 and the character length is "3" as stored in the primary area L2, the length of the decoded data stored in the storage area A3 is determined to be not equal to or greater than the character length. The decoding and conversion process then proceeds to the next decoding processing.

Next, as illustrated in FIG. 4C, in the decoding and conversion process, the encoded data, "0bBCh" in the storage area B1 are read out into the storage area A1 via the pointer PB1. In the decoding and conversion process, for the read out encoded data, decoding processing according to an identifier included in the encoded data is performed. In this case, since the identifier is "0", the character code itself, "BCh" (0xBC), is stored into the storage area A2 and storage area A3. In the decoding and conversion process, a length of the character code stored in the storage area A3 is then stored into the primary area L1. In this case, into the primary area L1, "2", indicating that the length is two bytes, from the one byte of the last time and the one byte of this time, is stored. By the decoding and conversion process, contents of the pointer PB1 and the pointer PA2 are then updated.

Figure 4D:
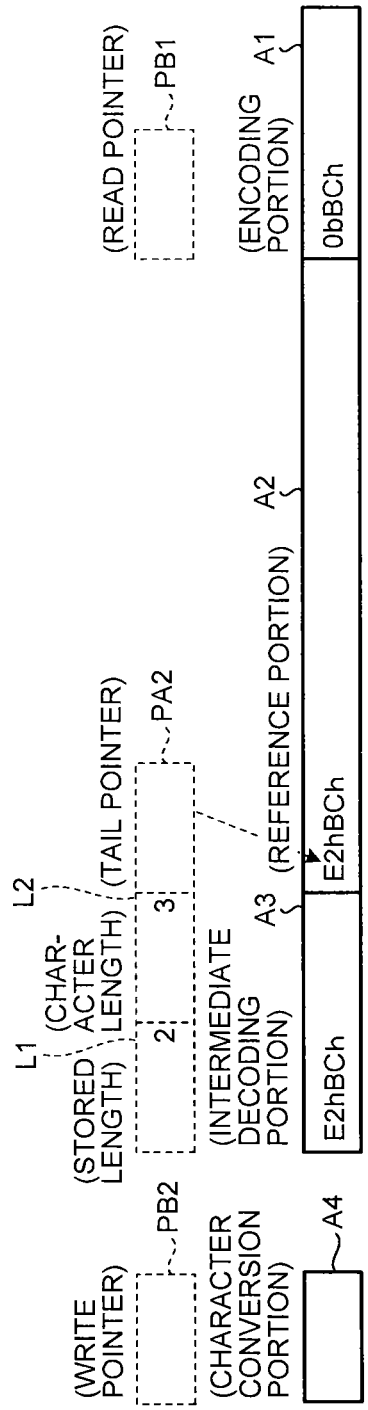
FIG. 4D is still another diagram illustrating the example of the decoding and conversion process according to the embodiment.

Next, as illustrated in FIG. 4D, in the decoding and conversion process, by using the head byte of the decoded data stored in the storage area A3, a length of a character code corresponding to one character is obtained as a character length. In the decoding and conversion process, the obtained character length is stored in the primary area L2. In this case, since the head byte is "E2", "3", indicating that the character length is three bytes, is stored into the primary area L2. In the decoding and conversion process, whether or not the length of the decoded data stored in the storage area A3 is equal to or greater than the obtained character length is determined. In this case, since the length of the decoded data stored in the storage area A3 is "2" as stored in the primary area L1 and the character length is "3" as stored in the primary area L2, the length of the decoded data stored in the storage area A3 is determined to be not equal to or greater than the character length. The decoding and conversion process then proceeds to the next decoding processing.

Figure 4E:
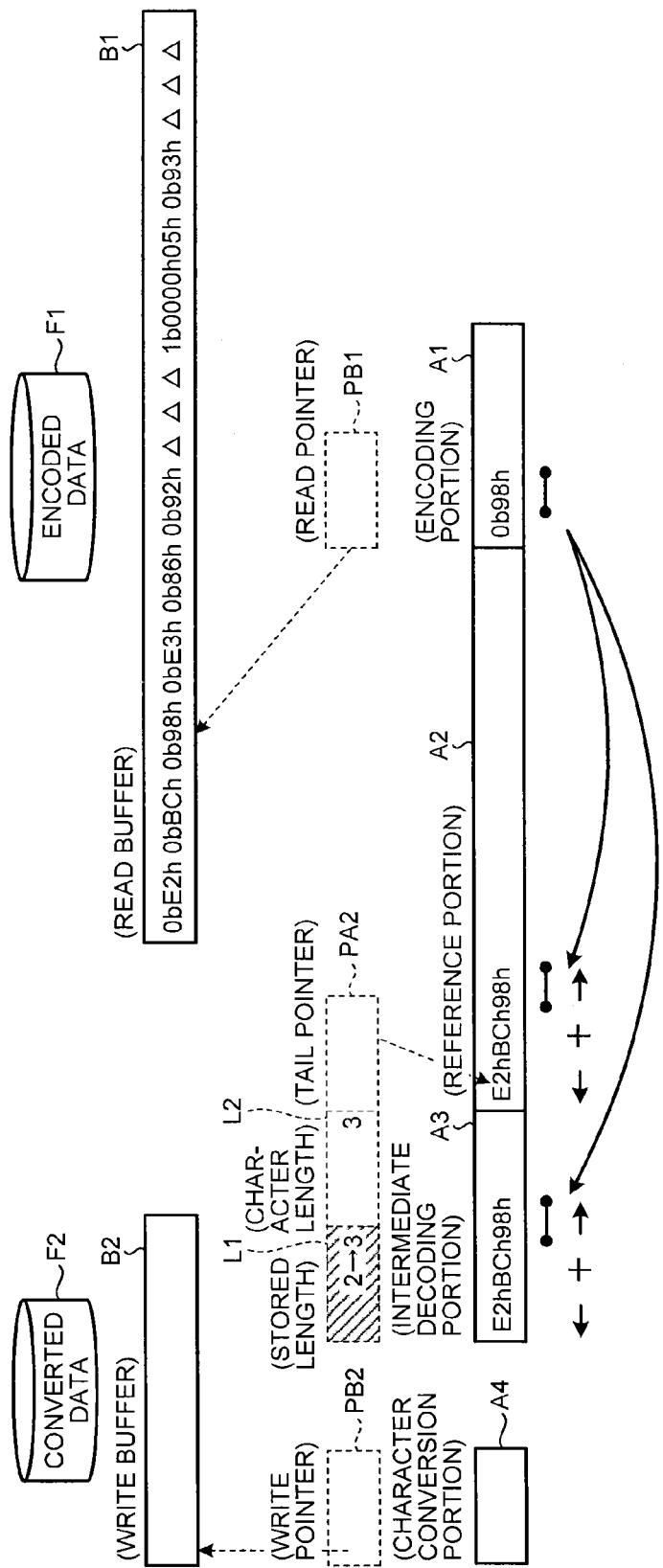
FIG. 4E is yet another diagram illustrating the example of the decoding and conversion process according to the embodiment.

Next, as illustrated in FIG. 4E, in the decoding and conversion process, the encoded data, "0b98h", in the storage area B1 are read out into the storage area A1 via the pointer PB1. In the decoding and conversion process, for the read out encoded data, decoding processing according to an identifier included in the encoded data is performed. In this case, since the identifier is "0", the character code itself, "98h" (0x98), is stored into the storage area A2 and storage area A3. In the decoding and conversion process, a total length of the character codes stored in the storage area A3 is then stored into the primary area L1. In this case, into the primary area L1, "3", indicating that the length is three bytes, from the two bytes of the last time and the one byte of this time, is stored. In the decoding and conversion process, contents of the pointer PB1 and the pointer PA2 are then updated.

Figure 4F:
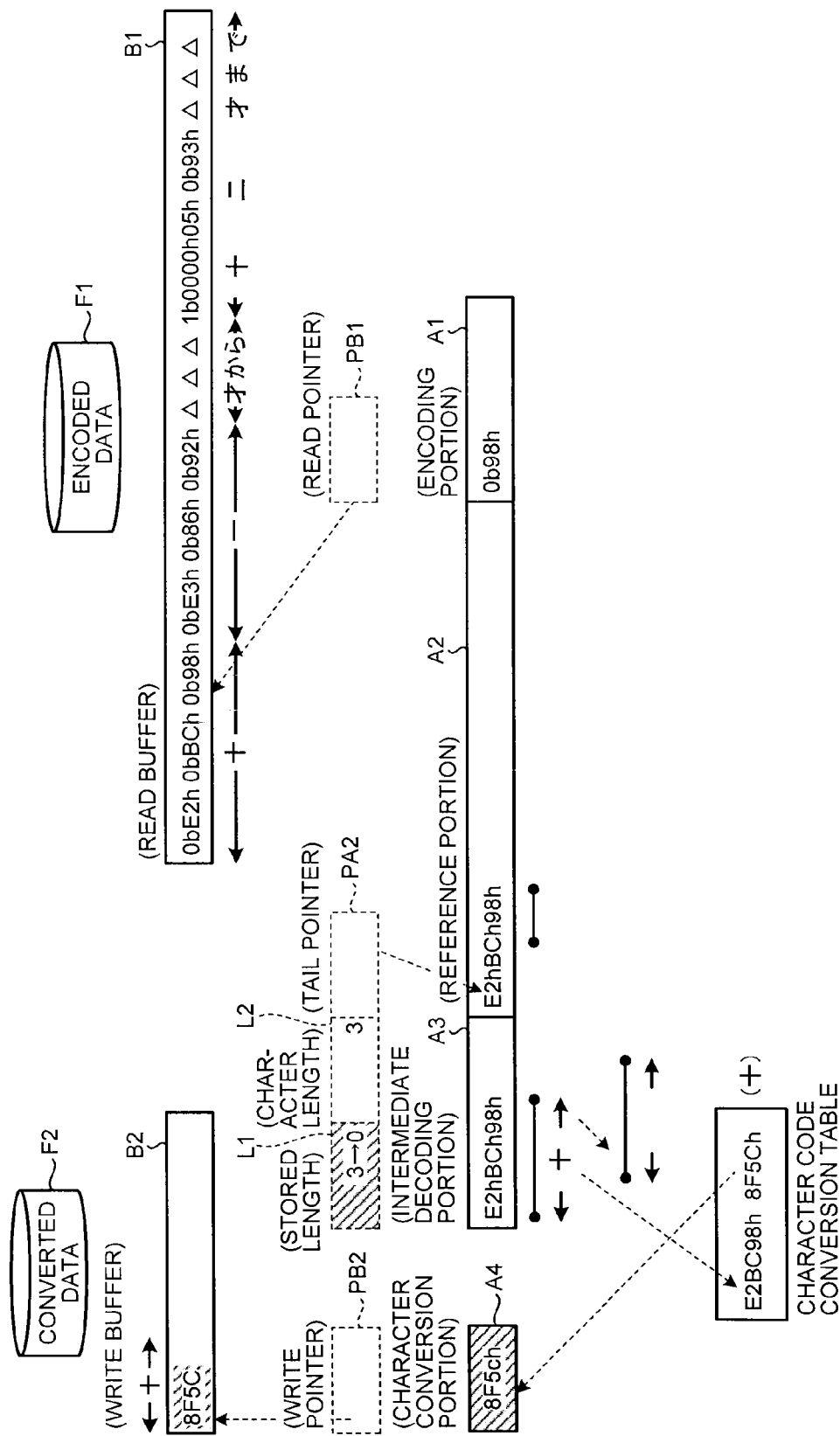
FIG. 4F is still another diagram illustrating the example of the decoding and conversion process according to the embodiment.

Next, as illustrated in FIG. 4F, in the decoding and conversion process, by using the head byte of the decoded data stored in the storage area A3, a length of a character code corresponding to one character is obtained as a character length. In the decoding and conversion process, the obtained character length is stored in the primary area L2. In this case, since the head byte is "E2", "3", indicating that the character length is three bytes, is stored in the primary area L2. In the decoding and conversion process, whether or not the length of the decoded data stored in the storage area A3 is equal to or greater than the obtained character length is determined. In this case, since the length of the decoded data stored in the storage area A3 is "3" as stored in the primary area L1 and the character length is "3" as stored in the primary area L2, the length of the decoded data stored in the storage area A3 is determined to be equal to or greater than the character length.

In the decoding and conversion process, if the length is determined to be equal to or greater than the obtained character length, the decoded data corresponding to the character length from the head of the storage area A3 are converted into a character code of a conversion destination via the storage area A4. For example, in the decoding and conversion process, based on the character code stored in the storage area A3, the character code of the conversion destination is obtained from a character code conversion table. In the decoding and conversion process, the obtained character code is stored into the storage area A4. The character code conversion table herein means a table used in conversion of character codes. FIG. 4F illustrates an example of the character code conversion table used in character code conversion between UTF-8 and Shift JIS for the character "+". In this case, in the decoding and conversion process, based on "E2BC98" of UTF-8 corresponding to the character length (3), "8F5C" of the conversion destination, Shift JIS, is obtained from the character code conversion table and stored into the storage area A4.

In the decoding and conversion process, the character code stored in the storage area A4 is then stored into the storage area B2. In the decoding and conversion process, the stored length stored in the primary area L1 is updated to "0" and the decoded data that have been subjected to the conversion in the storage area A3 are shifted to the left. As a result, in the storage area A3, the target to be converted in the decoded data is cleared. Accordingly, by the decoding and conversion process, while sequentially decoding encoded data, an end of a character is identified and decoded data up to the end of the character are able to be subjected to character code conversion.

Subsequently, in the decoding and conversion process, the decoding processing and conversion processing are repeated. As illustrated in FIG. 4G, in the decoding and conversion process, for the encoded data corresponding to "十一才から" in the encoded data stored in the storage area B1, the character codes obtained by conversion from UTF-8 to Shift JIS are stored into the storage area B2.

Figure 4H:
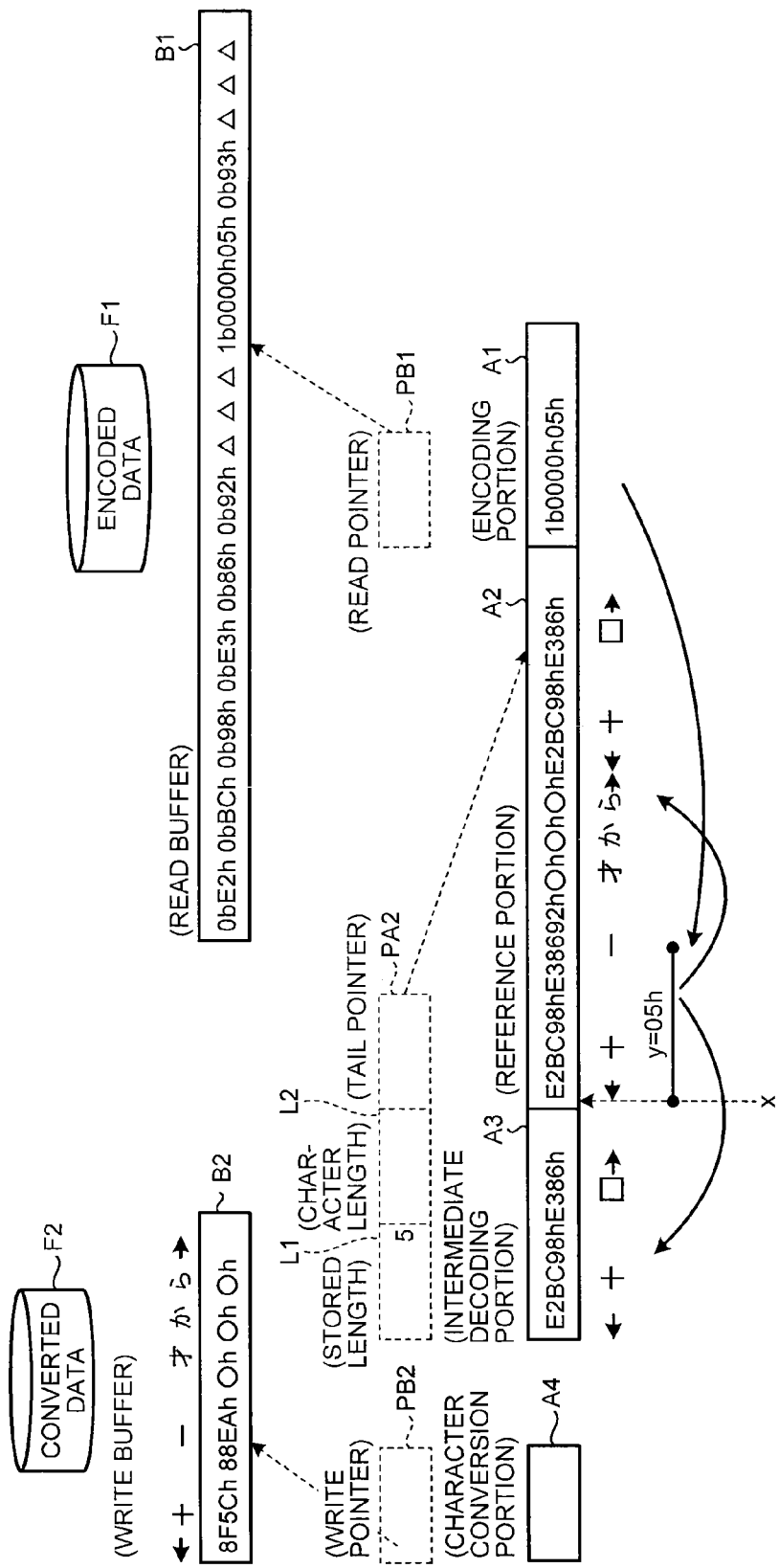
FIG. 4H is still another diagram illustrating the example of the decoding and conversion process according to the embodiment.

Next, as illustrated in FIG. 4H, in the decoding and conversion process, the encoded data "1b0000h05h" in the storage area B1 are read out into the storage area A1 via the pointer PB1. In the decoding and conversion process, for the read out encoded data, decoding processing according to an identifier included in the encoded data is performed. In this case, in the decoding and conversion process, since the identifier is "1", based on a data length and information on a position of the longest matching data included in the encoded data, a character code string is read out from the storage area A2 and the encoded data are decoded. That is, in the decoding and conversion process, based on "05h" indicating the data length of the longest matching data and "0000h" indicating the information on the position, the character code string, "E2BC98hE386h", is read out and the encoded data are decoded. In the decoding and conversion process, the read out character string, "E2BC98hE386h", is stored into the storage area A2 and storage area A3. Contents of the pointer PB1 and pointer PA2 are then updated.

Figure 4I:
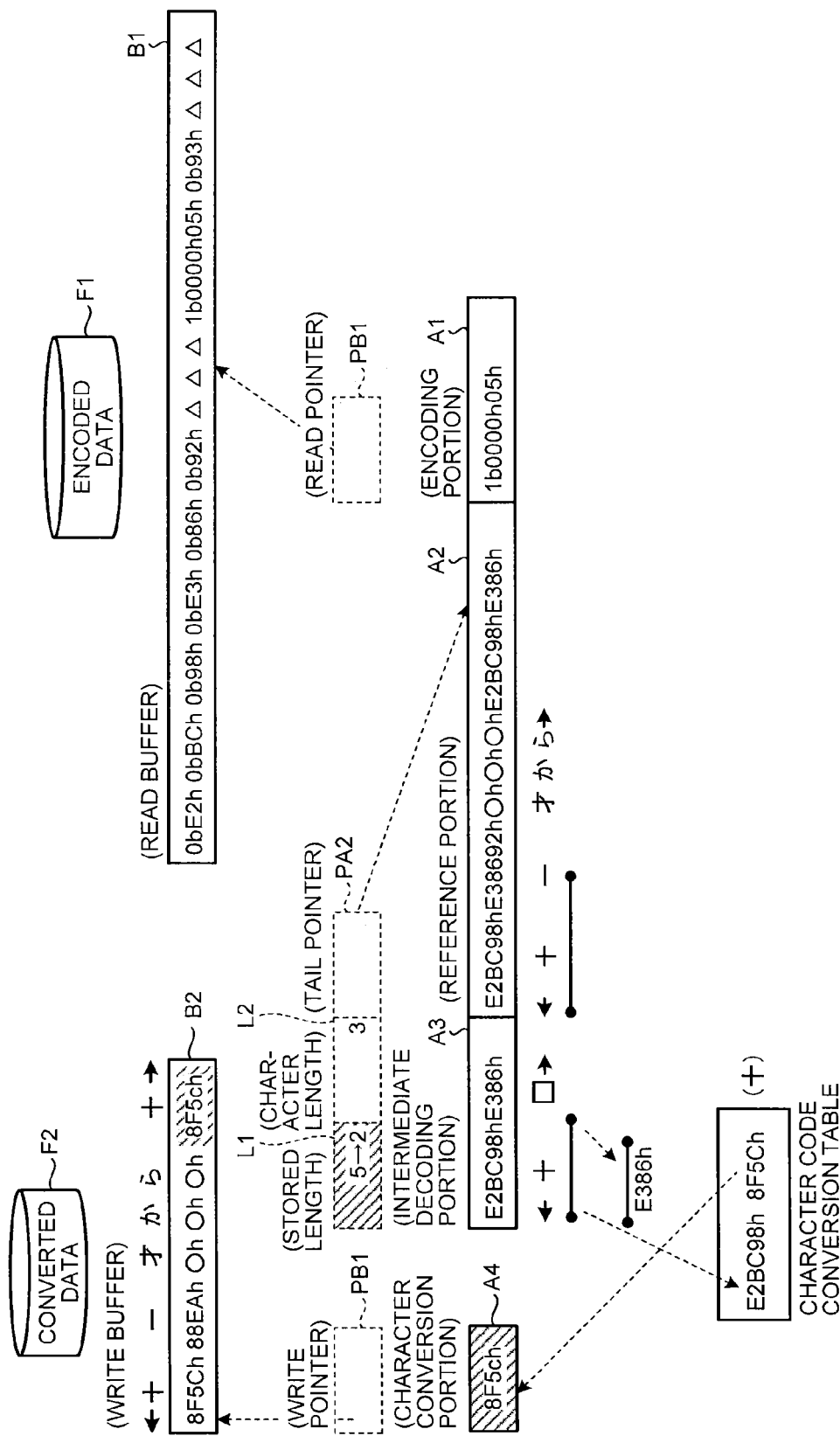
FIG. 4I is yet another diagram illustrating the example of the decoding and conversion process according to the embodiment.

Next, as illustrated in FIG. 4I, in the decoding and conversion process, by using the head byte of the decoded data stored in the storage area A3, a length of a character code corresponding to one character is obtained as a character length. In the decoding and conversion process, the obtained character length is stored into the primary area L2. In this case, since the head byte is "E2", "3", indicating that the character length is three bytes, is stored into the primary area L2. In the decoding and conversion process, whether or not the length of the decoded data stored in the storage area A3 is equal to or greater than the obtained character length is determined. In this case, since the length of the decoded data stored in the storage area A3 is "5" as stored in the primary area L1 and the character length is "3" as stored in the primary area L2, the length of the decoded data stored in the storage area A3 is determined to be equal to or greater than the character length.

In the decoding and conversion process, if the length is determined to be equal to or greater than the obtained character length, the decoded data up to the obtained character length are converted into a character code of the conversion destination via the storage area A4. For example, in the decoding and conversion process, based on the character code stored in the storage area A3, the characters of the conversion destination are obtained from the character code conversion table. In the decoding and conversion process, the obtained characters are stored into the storage area A4. In this case, in the decoding and conversion process, based on "E2BC98" of UTF-8 corresponding to the character length (3), "8F5C" of the conversion destination, Shift JIS, is obtained from the character code conversion table and stored into the storage area A4.

In the decoding and conversion process, the character code stored in the storage area A4 is stored into the storage area B2. In the decoding and conversion process, the stored length stored in the primary area L1 is updated to "2" and the decoded data that have been subjected to the conversion in the storage area A3 are shifted to the left. As a result, in the storage area A3, "E386" is stored. As a result, by the decoding and conversion process, while sequentially decoding encoded data, decoded data up to an end of a character are able to be subjected to character code conversion.

Figure 4J:
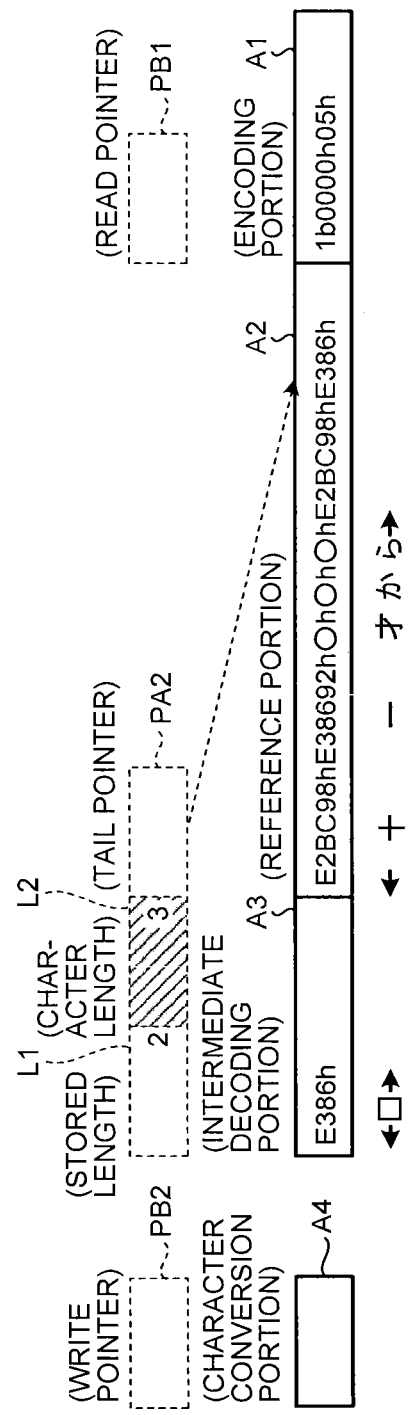
FIG. 4J is still another diagram illustrating the example of the decoding and conversion process according to the embodiment.

Next, as illustrated in FIG. 4J, in the decoding and conversion process, by using the head byte of the decoded data stored in the storage area A3, a length of a character code corresponding to one character is obtained as a character length. In the decoding and conversion process, the obtained character length is stored into the primary area L2. In this case, since the head byte is "E3", "3", indicating that the character length is three bytes, is stored into the primary area L2. In the decoding and conversion process, whether or not the length of the decoded data stored in the storage area A3 is equal to or greater than the obtained character length is determined. In this case, since the length of the decoded data stored in the storage area A3 is "2" as stored in the primary area L1 and the character length is "3" as stored in the primary area L2, the length of the decoded data stored in the storage area A3 is determined to be not equal to or greater than the character length. The decoding and conversion process then proceeds to the next decoding processing.

Figure 4K:
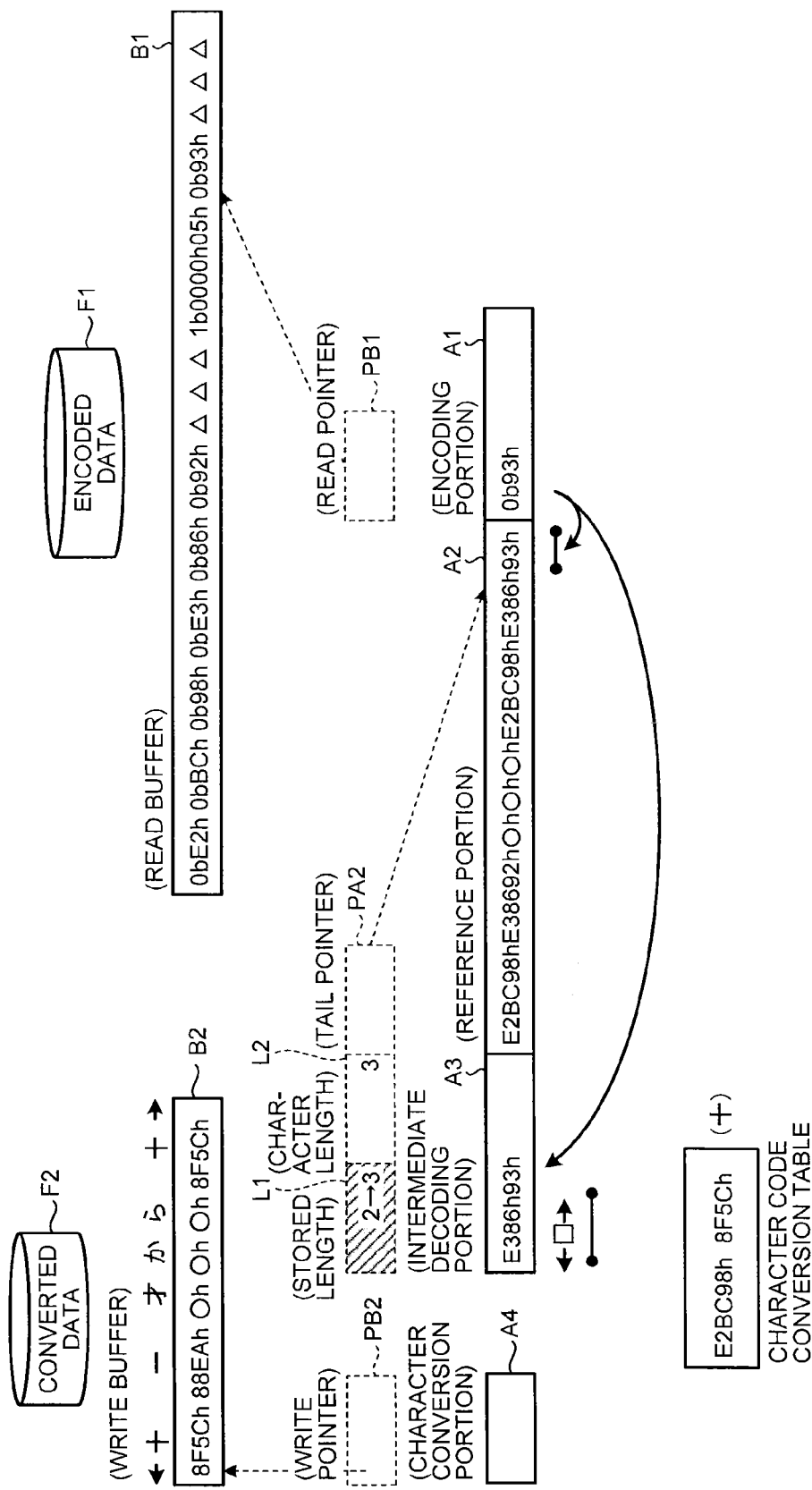
FIG. 4K is yet another diagram illustrating the example of the decoding and conversion process according to the embodiment.

Next, as illustrated in FIG. 4K, in the decoding and conversion process, the encoded data, "0b93h", in the storage area B1 are read out into the storage area A1 via the pointer PB1. In the decoding and conversion process, for the read out encoded data, decoding processing according to an identifier included in the encoded data is performed. In this case, since the identifier is "0", the character code itself, "93h" (0x93), is stored into the storage area A2 and storage area A3. In the decoding and conversion process, a total length of the character code stored in the storage area A3 is then stored into the primary area L1. In this case, into the primary area L1, "3", indicating that the length is three bytes, from the two bytes of the last time and the one byte of this time, is stored. In the decoding and conversion process, contents of the pointer PB1 and the pointer PA2 are then updated.

Figure 4L:
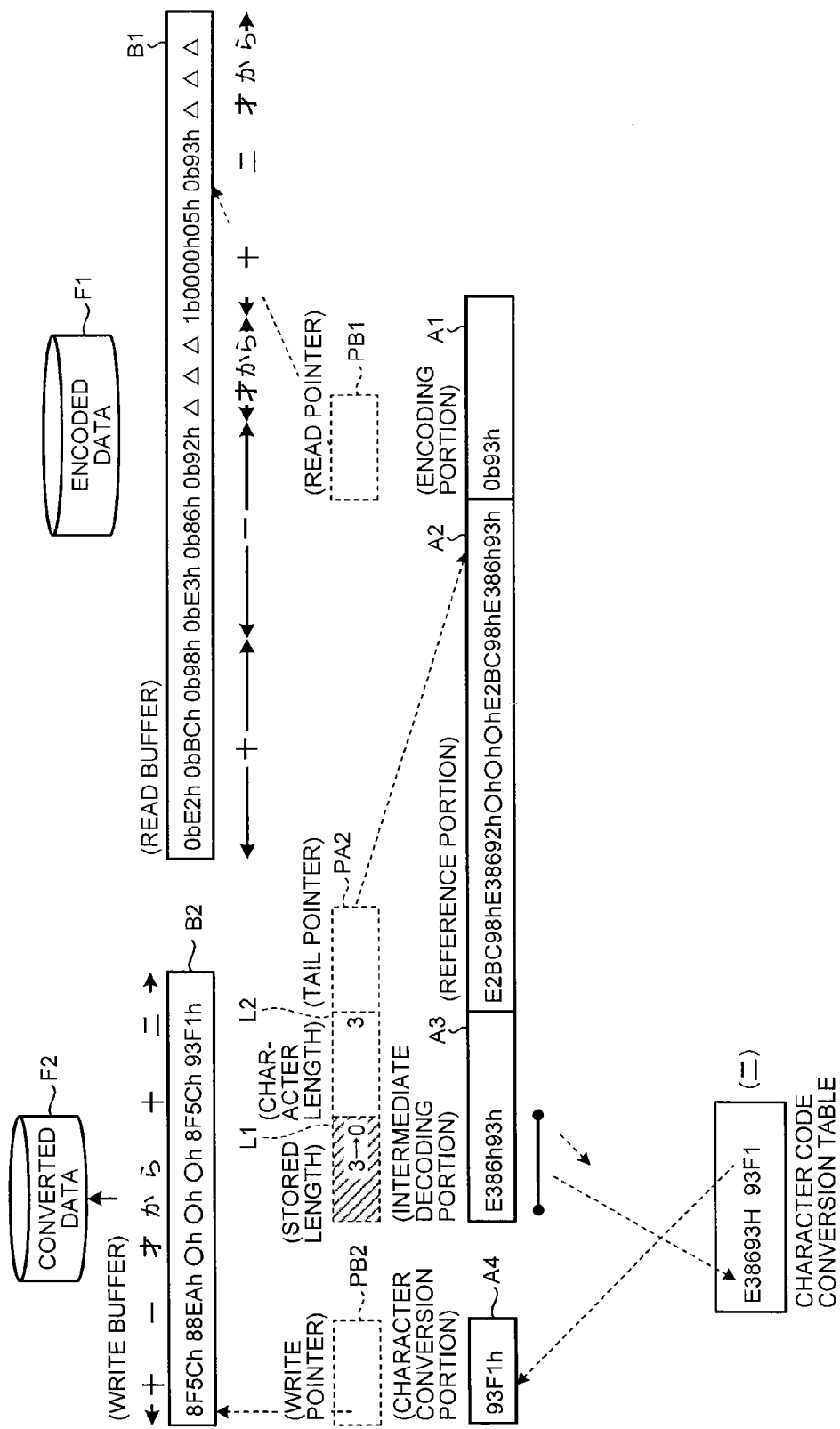
FIG. 4L is still another diagram illustrating the example of the decoding and conversion process according to the embodiment.

Next, as illustrated in FIG. 4L, in the decoding and conversion process, by using the head byte of the decoded data stored in the storage area A3, a length of a character code corresponding to one character is obtained as a character length. In the decoding and conversion process, the obtained character length is stored into the primary area L2. In this case, since the head byte is "E3", "3", indicating that the character length is three bytes, is stored into the primary area L2. In the decoding and conversion process, whether or not the length of the decoded data stored in the storage area A3 is equal to or greater than the obtained character length is determined. In this case, since the length of the decoded data stored in the storage area A3 is "3" as stored in the primary area L1 and the character length is "3" as stored in the primary area L2, the length of the decoded data stored in the storage area A3 is determined to be equal to or greater than the character length.

In the decoding and conversion process, if it is determined that the length is equal to or greater than the obtained character length, the decoded data up to the obtained character length are converted, via the storage area A4, into a character code of the conversion destination. For example, in the decoding and conversion process, based on the character code stored in the storage area A3, characters of the conversion destination are obtained from the character code conversion table. In the decoding and conversion process, the obtained characters are stored into the storage area A4. In this case, in the decoding and conversion process, based on "E38693" of UTF-8 corresponding to the character length (3), "93F1" of the conversion destination, Shift JIS, is obtained from the character code conversion table and stored into the storage area A4.

In the decoding and conversion process, the character code stored in the storage area A4 is stored into the storage area B2. In the decoding and conversion process, the stored length stored in the primary area L1 is updated to "0" and the decoded data that have been subjected to the conversion in the storage area A3 are shifted to the left. As a result, in the storage area A3, the target to be converted in the decoded data is cleared.

Thereafter, when all of the encoded data have been decoded, in the decoding and conversion process, based on the converted data stored in the storage area B2, the file F2 is generated. Accordingly, although in the decoding and conversion process, decoding is conducted byte by byte, since an end of a character of the decoded data is identified and the encoded data up to the end of the character are subjected to character code conversion to be stored in the storage area B2 as converted data, a storage area for accumulating all of the result of decoding is able to be reduced. Further, since the decoding and conversion process is able to realize character code conversion processing without accumulating all of the decoded data into a storage area or reading the decoded data from the storage area, the processing time is able to be shortened.

Functional Configuration of Decoding Apparatus According to Reference Example

Figure 5:
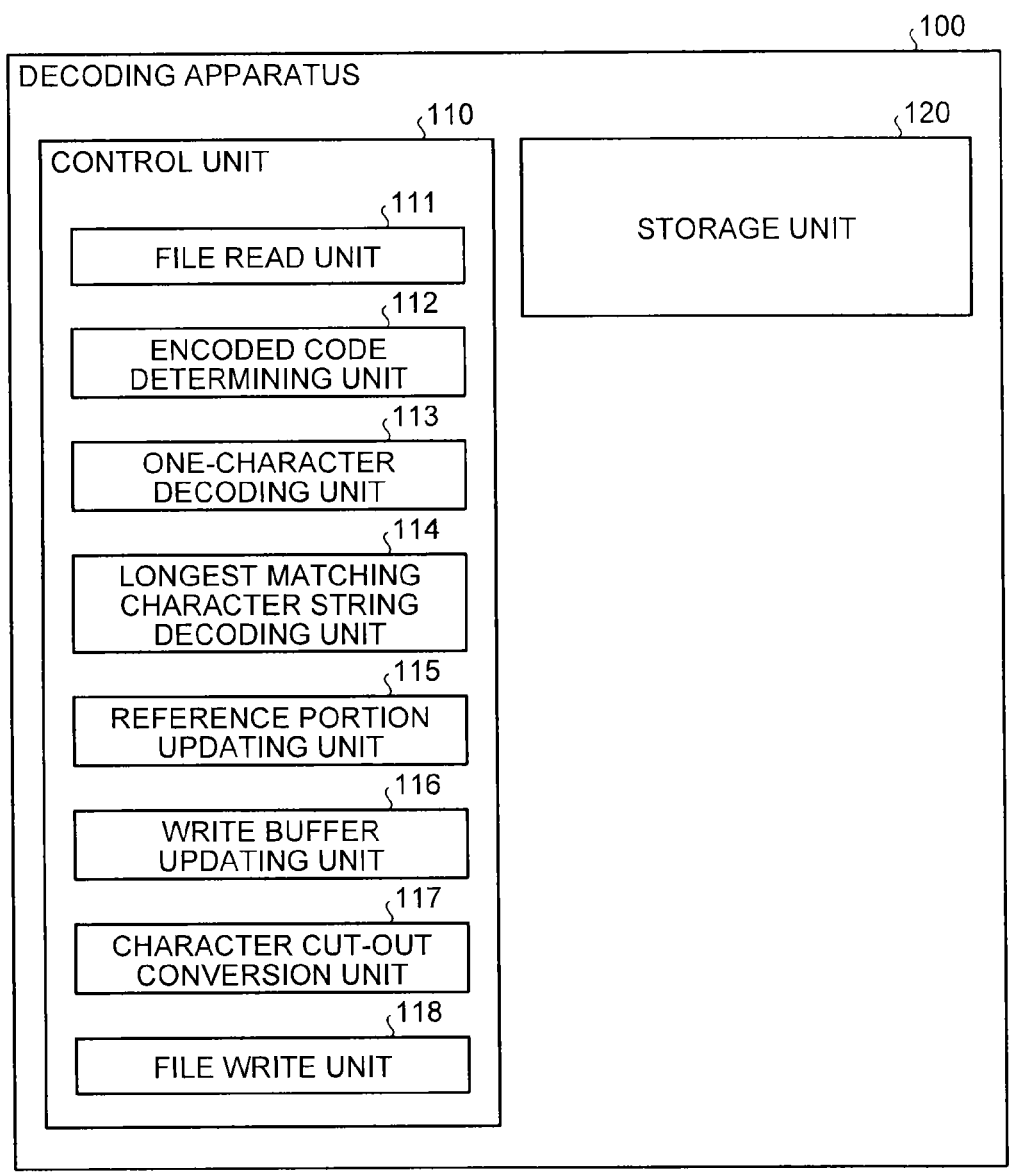
FIG. 5 is a diagram illustrating a first example of a functional configuration of a decoding apparatus.

Next, with reference to FIG. 5, a functional configuration of a decoding apparatus that executes a decoding and conversion process according to a reference example using the LZ77 system will be described. FIG. 5 is a diagram illustrating a first example of the functional configuration of the decoding apparatus. As illustrated in FIG. 5, a decoding apparatus 100 has a control unit 110 and a storage unit 120.

The control unit 110 has an internal memory for storing therein a program and control data, which prescribe various procedural sequences, and executes various types of processing by these. The control unit 110 corresponds to an electronic circuit of an integrated circuit, such as, for example, an application specific integrated circuit (ASIC) or a field programmable gate array (FPGA). Or, the control unit 110 corresponds to an electronic circuit, such as a central processing unit (CPU) or a micro processing unit (MPU). Further, the control unit 110 has a file read unit 111, a encoded code determining unit 112, a one-character decoding unit 113, a longest matching character string decoding unit 114, a reference portion updating unit 115, a write buffer updating unit 116, a character cut-out conversion unit 117, and a file write unit 118.

The storage unit 120 corresponds to a storage device, such as a non-volatile semiconductor memory element, for example, a flash memory, or a Ferroelectric Random Access Memory (FRAM) (registered trademark). In the storage unit 120, the file F1 storing therein encoded data obtained by encoding processing and the file F2 obtained by decoding and converting the encoded data stored in the file F1, are stored. Further, the storage unit 120 is used as a work area of the control unit 110.

The control unit 110 controls each of these functional units to realize decoding processing and conversion processing. The control unit 110 secures a storage area in the storage unit 120 in order to hold data used in processing of each of these functional units. The storage area is, for example, the above described storage areas A1, A2, B1, B2, and B3. Hereinafter, the storage areas A1, A2, B1, B2, and B3 will be described by being respectively referred to as "encoding portion", "reference portion", "read buffer", "write buffer", and "after-conversion buffer".

The file read unit 111 reads out the encoded data from the file F1 storing therein the encoded data and stores the encoded data into the read buffer secured in the storage unit 120.

The encoded code determining unit 112 reads out a encoded code at a position to be read out in the read buffer and determines an identifier included in the read out encoded code.

The one-character decoding unit 113 decodes one character of the encoded code, if the identifier is determined to be the identifier indicating that the encoded code is not based on the longest matching data.

The longest matching character string decoding unit 114 conducts decoding into the longest matching character string based on the encoded code, if the identifier is determined to be the identifier indicating that the encoded code is based on the longest matching data. For example, the longest matching character string decoding unit 114 reads out, based on a data length and information on a position of the longest matching data included in the encoded code, a character code string from the reference portion.

The reference portion updating unit 115 stores the character code of the one character that has been decoded by the one-character decoding unit 113, into the reference portion, and updates the reference portion. The reference portion updating unit 115 stores the character code string that has been decoded by the longest matching character string decoding unit 114 into the reference portion and updates the reference portion.

The write buffer updating unit 116 stores the character code of the one character that has been decoded by the one-character decoding unit 113 into the write buffer and updates the write buffer. The write buffer updating unit 116 stores the character code string that has been decoded by the longest matching character string decoding unit 114 into the write buffer and updates the write buffer. For example, the write buffer updating unit 116 stores, after the character code string that has been stored in the write buffer already, the character code of the one character or character code string that has been decoded this time.

The character cut-out conversion unit 117 sequentially cuts out a character code string corresponding to one character from the write buffer when all of the encoded data have been decoded. The character cut-out conversion unit 117 converts the cut-out character code string into a character code string of a character code system used at the transmission destination. The character cut-out conversion unit 117 stores the converted character code string into the after-conversion buffer.

The file write unit 118 writes the converted data after the conversion that have been stored in the after-conversion buffer, into the file F2. Accordingly, since the decoding apparatus 100 conducts character code conversion on decoded data after decoding after the entire encoded data have been decoded, the write buffer and the after-conversion buffer are needed and a storage area therefor is unable to be suppressed. Further, since the I/O to/from the write buffer used in the decoding processing is generated, the processing time of the decoding processing including the character code conversion processing becomes longer.

Functional Configuration of Decoding Apparatus According to Embodiment

Figure 6:
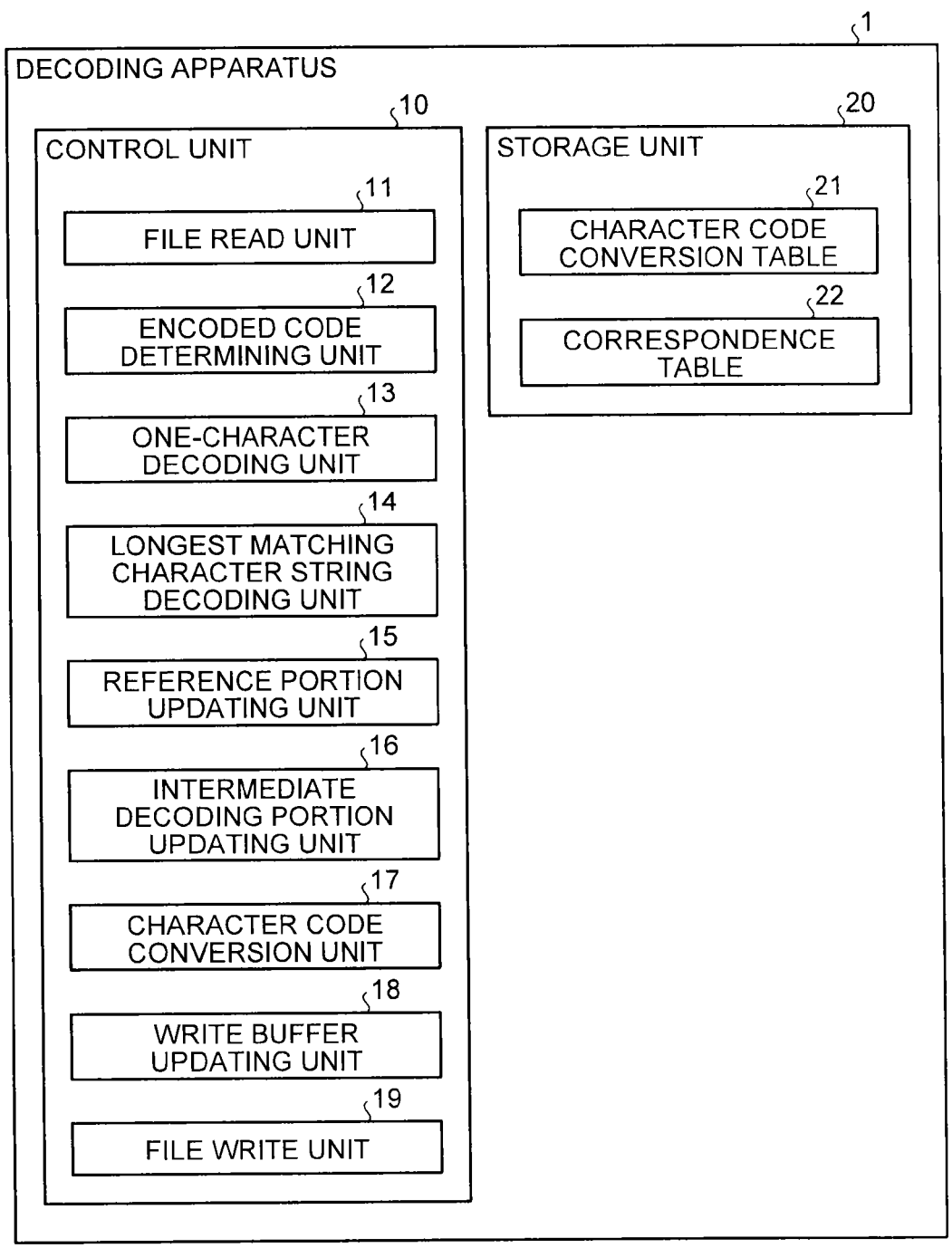
FIG. 6 is a diagram illustrating a second example of a functional configuration of a decoding apparatus.

Next, with reference to FIG. 6, a functional configuration of a decoding apparatus that executes a decoding and conversion process according to an embodiment will be described. FIG. 6 is a diagram illustrating a second example of the functional configuration of the decoding apparatus. As illustrated in FIG. 6, a decoding apparatus 1 has a control unit 10 and a storage unit 20.

The control unit 10 has an internal memory for storing therein a program and control data, which prescribe various procedural sequences, and executes various types of processing by these. The control unit 10 corresponds to, for example, an electronic circuit of an integrated circuit, such as an ASIC or FPGA. Or, the control unit 10 corresponds to an electronic circuit, such as a CPU or MPU. Further, the control unit 10 has a file read unit 11, an encoded code determining unit 12, a one-character decoding unit 13, a longest matching character string decoding unit 14, a reference portion updating unit 15, an intermediate decoding portion updating unit 16, a character code conversion unit 17, a write buffer updating unit 18, and a file write unit 19.

The storage unit 20 corresponds to a storage device, such as a non-volatile semiconductor memory element, for example, a flash memory, or FRAM. In the storage unit 20, the file F1 storing therein encoded data obtained by encoding processing and the file F2 obtained by decoding and converting the encoded data stored in the file F1, are stored. For example, the storage unit 20 stores there in a character code conversion table 21 and a correspondence table 22. Further, the storage unit 20 is used as a work area of the control unit 10.

The character code conversion table 21 is used in conversion of character codes. The character code conversion table 21 stores therein, per character, data strings of character codes of a conversion source in association with data strings of character codes of a conversion destination. A data configuration of the character code conversion table 21 will be described later.

The correspondence table 22 stores therein correspondence between character codes of head bytes of characters and character lengths indicating lengths of the character codes of the characters. For example, if the character code system is UTF-8 and the character code of the head byte is "E3", "3" (in bytes) is stored as the character length. Further, if the character code of the head byte is "E2", "3" (in bytes) is stored as the character length.

The control unit 10 realizes decoding processing and conversion processing by controlling each of these functional units. The control unit 10 secures a storage area in the storage unit 20 in order to hold data used in processing of each of these functional units. The storage area is, for example, the above described storage areas A1 to A4, B1, and B2. Hereinafter, the storage areas A1 to A4 will be described respectively as "encoding portion", "reference portion", "intermediate decoding portion", and "character conversion portion". The storage areas B1 and B2 will be described respectively as "read buffer" and "write buffer".

The file read unit 11 reads out the encoded data from the file F1 storing therein the encoded data and stores the encoded data into the read buffer secured in the storage unit 20. For example, the file read unit 11 reads the encoded data from the file F1 when the decoding and conversion process for the specified file F1 is called. The file read unit 11 stores the read out encoded data into the read buffer. The file read unit 11 obtains a character code system used at the transmission destination when the call for the decoding and conversion process is executed.

The encoded code determining unit 12 reads out a encoded code at a position to be read in the read buffer and determines an identifier included in the read out encoded code. For example, the encoded code determining unit 12 determines whether the identifier included in the encoded code at the position to be read out is the identifier indicating that the encoded code is not based on the longest matching data or whether the identifier is the identifier indicating that the encoded code is based on the longest matching data. For example, if the encoded code is "0bE2h", since the identifier included in the head of the encoded code is "0", the identifier is determined to be the identifier indicating that the encoded code is not based on the longest matching data. In another example, if the encoded code is "1b0000h05h", since the identifier included in the head of the encoded code is "1", the identifier is determined to be the identifier indicating that the encoded code is based on the longest matching data.

The one-character decoding unit 13 decodes one character of the encoded code if the identifier is determined to be the identifier indicating that the encoded code is not based on the longest matching data. For example, the one-character decoding unit 13 decodes the character code itself included in the encoded code if the identifier is determined to be "0". For example, if the encoded code is "0bE2h", "E2h" is obtained as the decoded code.

The longest matching character string decoding unit 14 performs decoding into a longest matching character string based on the encoded code, if the identifier is determined to be the identifier indicating that the encoded code is based on longest matching data. For example, if the identifier is determined to be "1", the longest matching character string decoding unit 14 reads out, based on a data length and information on a position of the longest matching data included in the encoded code, a character code string from the reference portion. For example, if the encoded code is "1b0000h05h", a character code string corresponding to a data length, "05h", from a position, "0000h", in the reference portion is read out.

The reference portion updating unit 15 stores the character code of the one character decoded by the one-character decoding unit 13 into the reference portion and updates the reference portion. The reference portion updating unit 15 stores the character code string that has been decoded by the longest matching character string decoding unit 14 into the reference portion and updates the reference portion.

The intermediate decoding portion updating unit 16 updates the intermediate decoding portion. For example, the intermediate decoding portion updating unit 16 stores the character code of the one character decoded by the one-character decoding unit 13 into the intermediate decoding portion and updates the intermediate decoding portion. Further, the intermediate decoding portion updating unit 16 stores the character code string that has been decoded by the longest matching character string decoding unit 14 into the intermediate decoding portion and updates the intermediate decoding portion. Further, the intermediate decoding portion updating unit 16 obtains, based on the head byte of the intermediate decoding portion, from the correspondence table 22, the character length. Further, the intermediate decoding portion updating unit 16 determines whether or not the length of the decoded data stored in the intermediate decoding portion is equal to or greater than the character length. If the length of the decoded data stored in the intermediate decoding portion is determined to be equal to or greater than the character length, the intermediate decoding portion updating unit 16 detects an end of a character and regards decoded data corresponding to the character length from the head of the intermediate decoding portion as a target to be converted. If the length of the decoded data stored in the intermediate decoding portion is determined to be not equal to or greater than the character length, the intermediate decoding portion updating unit 16 is unable to detect the end of the character and proceeds to decoding processing of the next encoded code.

The character code conversion unit 17 converts the character code of decoded data. For example, the character code conversion unit 17 obtains from the character code conversion table 21, a character code of the character code system of the conversion destination, based on the character code of the decoded data regarded by the intermediate decoding portion updating unit 16 as the target to be converted. The character code conversion unit 17 stores the obtained character code into the character conversion portion.

The write buffer updating unit 18 stores the character code converted by the character code conversion unit 17 as converted data into the write buffer and updates the write buffer. For example, the write buffer updating unit 18 stores the character code that has been converted this time, after the character code that has been already stored in the write buffer.

The file write unit 19 writes the converted data after the conversion that have been stored in the write buffer, into the file F2. Accordingly, although decoding is conducted byte by byte, since the decoding apparatus 1 identifies an end of a character in decoded data, performs character code conversion of the decoded data up to the end of the character, and performs storage thereof into the write buffer, a storage area for accumulating the decoded data is able to be reduced. Further, since the decoding apparatus 1 is able to realize character code conversion processing without accumulating all of the decoded data in a storage area and reading out the decoded data from the storage area, the processing time is able to be shortened.

Data Configuration of Character Code Conversion Table

Figure 7:
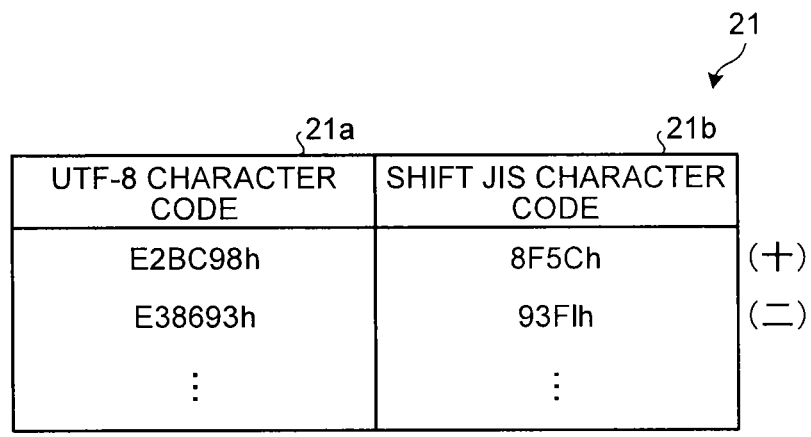
FIG. 7 is a diagram illustrating an example of a data configuration of a character code conversion table.

Next, with reference to FIG. 7, a data configuration of a character code conversion table will be described. FIG. 7 is a diagram illustrating an example of the data configuration of the character code conversion table 21. As illustrated in FIG. 7, the character code conversion table 21 stores therein character codes 21*a* of UTF-8 in association with character codes 21*b* of Shift JIS. The character codes 21*a* of UTF-8 are data strings of character codes, each corresponding to one character for the UTF-8 character code system. The character codes 21*b* of Shift JIS are data strings of character codes, each corresponding to one character for the Shift JIS character code system. For example, if the character is "+", "E2BC98h" as the character code 21*a* of UTF-8 and "8F5Ch" as the character code 21*b* of Shift JIS are stored therein. In the example of FIG. 7, the character code conversion table 21 has therein the character codes of UTF-8 and character codes of Shift JIS associated with each other, but not being limited thereto, any different character code systems may be associated with each other therein.

Flow Chart of Decoding and Conversion Process

Figure 8:
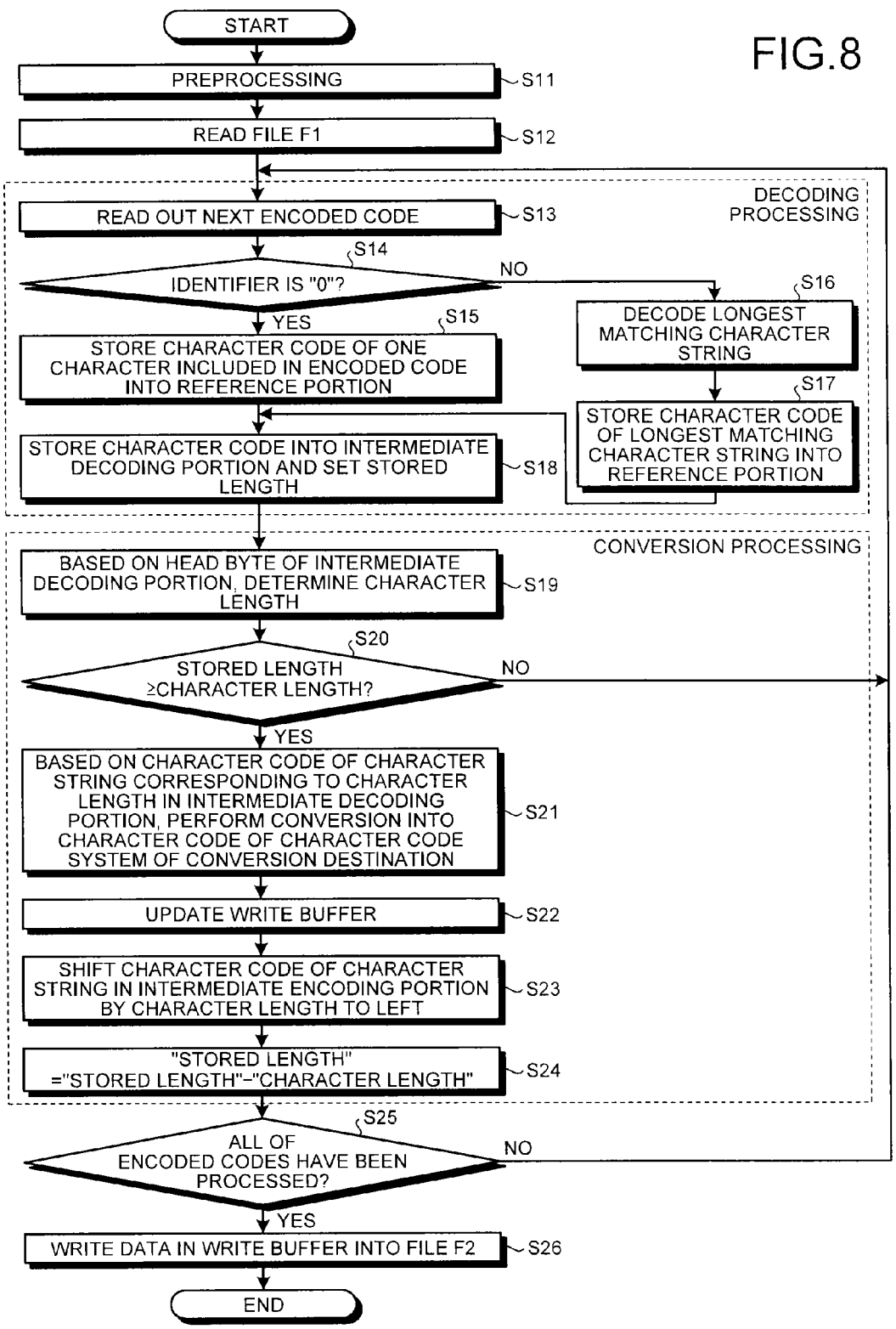
FIG. 8 is a diagram illustrating a flow chart of the decoding and conversion process.

Next, with reference to FIG. 8, a sequence of a decoding and conversion process will be described. FIG. 8 is a diagram illustrating a flow chart of the decoding and conversion process.

First, by operation of an operating system and an application program in the decoding apparatus 1, the decoding and conversion process is called. When the decoding and conversion process is called, the control unit 10 executes preprocessing (Step S11). For example, the control unit 10 secures the storage areas A1 to A4 and the storage areas B1 and B2 illustrated in FIG. 4A. Further, the control unit 10 sets each piece of positional information in each of the storage areas (for example, each of the pointers illustrated in FIG. 4A). In the following description, the storage areas A1 to A4 will be respectively referred to, as the encoding portion, the reference portion, the intermediate decoding portion, and the character conversion portion, for example. The storage areas B1 and B2 will be respectively referred to, as the read buffer and the write buffer, for example. The pointers PB1, PB2, and PA2 will be respectively referred to, as the write pointer, the read pointer, and the tail pointer, for example.

The file read unit 11 reads out the encoded data stored in the file F1 into the read buffer (Step S12).

The encoded code determining unit 12 reads out the next encoded code from the read buffer (Step S13). For example, the encoded code determining unit 12 reads out a encoded code at a position to be read pointed by the read pointer, from the read buffer. The encoded code determining unit 12 determines whether or not the identifier of the read out encoded code is the identifier ("0") indicating that the encoded code is not based on longest matching data (Step S14).

If the identifier is "0" (Step S14; Yes), the one-character decoding unit 13 reads out the character code of one character included in the read out encoded code. The reference portion updating unit 15 stores the read out character code into the reference portion (Step S15). The decoding and conversion process then proceeds to Step S18.

On the contrary, if the identifier is not "0" (Step S14; No), the longest matching character string decoding unit 14 decodes, based on the data length and position included in the read out encoded code, the longest matching character string (Step S16). For example, the longest matching character string decoding unit 14 reads out the character code string corresponding to the data length from the position in the reference portion and decodes the longest matching character string. The reference portion updating unit 15 then stores the character code of the decoded longest matching character string into the reference portion (Step S17). The decoding and conversion process then proceeds to Step S18.

At Step S18, the intermediate decoding portion updating unit 16 stores the character code into the intermediate decoding portion and sets a stored length thereof (Step S18). For example, the intermediate decoding portion updating unit 16 stores the character code of the one character decoded by the one-character decoding unit 13 into the intermediate decoding portion and updates the intermediate decoding portion. The intermediate decoding portion updating unit 16 stores the character code of the longest matching character string that has been decoded by the longest matching character string decoding unit 14 into the intermediate decoding portion and updates the intermediate decoding portion. The intermediate decoding portion updating unit 16 then sets the length of the character code stored in the intermediate decoding portion as the stored length, into the primary area. The intermediate decoding portion updating unit 16 then updates contents of the read pointer of the read buffer and the tail pointer of the reference portion.

Subsequently, the intermediate decoding portion updating unit 16 determines the character length based on the head byte in the intermediate decoding portion (Step S19). For example, the intermediate decoding portion updating unit 16 obtains, based on the head byte in the intermediate decoding portion, from the correspondence table 22, the character length. For example, if the character code system is UTF-8, when the head byte is "E3", from the correspondence, "3", indicating that the character length is three bytes, is obtained.

The intermediate decoding portion updating unit 16 determines whether or not the stored length is equal to or greater than the character length (Step S20). If the stored length is not equal to or greater than the character length (Step S20; No), the character code conversion unit 17 proceeds to Step S13 to process the next encoded code.

On the contrary, if the stored length is equal to or greater than the character length (Step S20; Yes), the character code conversion unit 17 performs conversion, based on the character code of the character string corresponding to the character length in the intermediate decoding portion, into the character code of the character code system of the conversion destination (Step S21). For example, the character code conversion unit 17 obtains, based on the character code string corresponding to the character length from the head of the intermediate decoding portion, from the character code conversion table 21, the character code string of the character code system of the conversion destination. The character code conversion unit 17 then stores the obtained character code string into the character conversion portion.

The write buffer updating unit 18 stores the character code string stored in the character conversion portion into the write buffer and updates the write buffer (Step S22). For example, the write buffer updating unit 18 stores, after the character code string already stored in the write buffer, the character code string stored in the character conversion portion.

The write buffer updating unit 18 shifts the character code string of the character string stored in the intermediate decoding portion to the left by the character length for which conversion has been completed (Step S23). The write buffer updating unit 18 subtracts the character length from the stored length presently set in the primary area to calculate a new stored length (Step S24). That is, the write buffer updating unit 18 calculates the length of the character code stored in the intermediate decoding portion as the stored length.

Subsequently, the encoded code determining unit 12 determines whether or not all of the encoded codes have been processed (Step S25). If it is determined that all of the encoded codes have not been processed (Step S25; No), the encoded code determining unit 12 proceeds to Step S13 to process the next encoded code.

On the contrary, if it is determined that all of the encoded codes have been processed (Step S25; Yes), the file write unit 19 writes the converted data stored in the write buffer into the file F2 (Step S26). Thereby, the decoding and conversion process ends.

Effects of Embodiment

According to the above described embodiment, the decoding apparatus 1 accumulates a data string obtained by decoding a code in a code string into the intermediate decoding portion, when decoding a encoded code string without recognizing an end of a character. When a character of a first character code is recognized in the data string accumulated in the intermediate decoding portion, the decoding apparatus 1 converts the data string of the recognized character into a data string of a second character code. According to this configuration, the decoding apparatus 1 decodes a encoded code string without recognizing an end of a character, but since a data string recognized as a character from the data string obtained by the decoding is subjected to character code conversion, waste in the storage area used in the decoding processing is able to be eliminated and the processing time is able to be shortened.

Further, according to the above described embodiment, the decoding apparatus 1 decodes a first code into a data string representing a byte string of a particular group that becomes the longest match by using a slide window, and accumulates the decoded data string into the intermediate decoding portion. The decoding apparatus 1 determines, at the timing of the decoding of the first code, whether or not a character of the first character code is recognized in the data string accumulated in the intermediate decoding portion. If it is determined that a character of the first character code is recognized in the data string accumulated in the intermediate decoding portion, the decoding apparatus 1 converts the data string of the recognized character into a data string of the second character code. According to this configuration, since the decoding apparatus 1 determines whether or not a character is recognized in the data string obtained by the decoding at the timing of the decoding and subjects the data string recognized as the character to character code conversion, the storage area used in the decoding processing is able to be prevented from being wasted.

Further, according to the above described embodiment, the decoding apparatus 1 obtains, based on correspondence between a character code of a head byte of a character and a character length indicating a length of a character code of the character, a character length corresponding to the character code of the head byte of the decoded data string accumulated in the storage area. The decoding apparatus 1 then determines whether or not the length of the decoded data string stored in the storage area is equal to or greater than the character length. If the length is determined to be equal to or greater than the character length, the decoding apparatus 1 converts the decoded data string corresponding to the character length from the head of the decoded data string into a data string of the second character code. According to this configuration, since the decoding apparatus 1 uses the correspondence between the character code of the head byte of the character and the character length of the character, an end of the character in the decoded data string is able to be detected. As a result, the decoding apparatus 1 is able to realize character code conversion up to an end of a character in a decoded data string while decoding a encoded code string.

Further, according to the above described embodiment, the decoding apparatus 1 converts the decoded data string corresponding to the character length from the head of the decoded data string into the character code used at the transmission destination and shifts the decoded data string corresponding to the character length from the head of the decoded data string to the left as a data string that has been processed. According to this configuration, the decoding apparatus 1 is able to subject the one next to the converted part of the decoded data string to conversion and is able to perform conversion processing efficiently while decoding the encoded code string.

Further, according to the above described embodiment, the decoding apparatus 1 selects, from a plurality of pieces of conversion information, which are pieces of conversion information associating, per character, character codes of a conversion source with character codes of a conversion destination and which are in pairs of conversion sources and conversion destinations, conversion information according to the conversion source and conversion destination. The decoding apparatus 1 converts the decoded data string corresponding to the character length from the head of the decoded data string into a character code of the conversion destination, by using the selected conversion information. According to this configuration, since the decoding apparatus 1 converts character codes from the conversion source to the conversion destination by using the conversion information according to the conversion source and conversion destination, when encoded data are subjected to character code conversion to be transferred to a transmission destination, multi-purpose use thereof is able to be realized.

Other Modes Related to Embodiments

Hereinafter, some of modified examples of the above described embodiments will be described. Not only the modified examples described below, but also any design change without departing from the spirit of the present invention may be made as appropriate.

In the embodiments, the character code conversion table 21 has been described as associating between different character code systems. That is, the character code conversion table 21 has been described as associating between, for example, data strings of character codes of UTF-8 and data strings of character codes of Shift JIS. However, the character code conversion table 21 is not limited to this, and may be plurally present, each with a pair of character codes of a conversion source and character codes of a conversion destination. If a plurality of character code conversion tables 21 are present, the character code conversion unit 17 selects a character code conversion table 21 according to character codes of the conversion source and character codes of the conversion destination, from the plurality of character code conversion tables 21. The character code conversion unit 17 may convert the decoded data string corresponding to the character length from the head of the decoded data string into the data string of the character code of the conversion destination, by using the selected character code conversion table 21.

Further, in the embodiments, each of the illustrated components of the apparatuses is not necessarily configured physically as illustrated in the drawings. That is, a specific mode of separation and integration of the devices is not limited to those illustrated in the drawings, and all or a part thereof may be configured by functionally or physically separating or integrating the devices in arbitrary units depending on various loads and use situations. For example, the one-character decoding unit 13 and the reference portion updating unit 15, and the longest matching character string decoding unit 14 and the reference portion updating unit 15 may be respectively integrated as single units. Further, the intermediate decoding portion updating unit 16 may be separated into an updating unit that updates the intermediate decoding portion, an obtaining unit that obtains the character length, and a determining unit that determines whether or not the length of the decoded data is equal to or greater than the character length. Further, the storage unit 20 may be stored in an external device of the decoding apparatus 1, or an external device storing therein the storage unit 20 may be connected to the decoding apparatus 1 via a network.

Hardware Configuration of Decoding Apparatus

Figure 9:
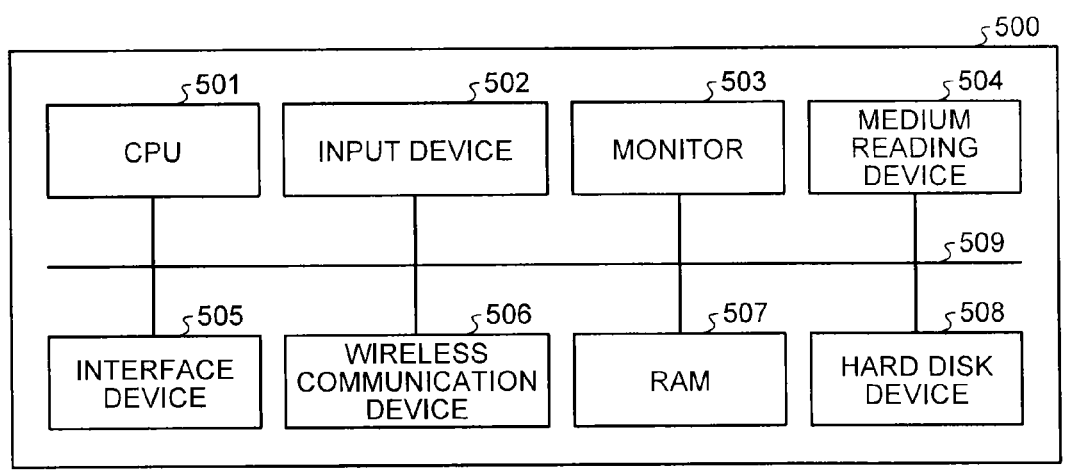
FIG. 9 is a diagram illustrating a hardware configuration of the decoding apparatus.

FIG. 9 is a diagram illustrating a hardware configuration of a decoding apparatus. As illustrated in FIG. 9, a computer 500 has a CPU 501 that executes various types of arithmetic processing, an input device 502 that receives data input from a user, and a monitor 503. Further, the computer 500 has a medium reading device 504 that reads a program and the like from a storage medium, an interface device 505 for connecting to another device, and a wireless communication device 506 for connecting wirelessly to another device. Further, the computer 500 has a random access memory (RAM) 507 that temporarily stores therein various pieces of information, and a hard disk device 508. Further, each of these devices 501 to 508 is connected to a bus 509.

The hard disk device 508 stores therein a computer-readable recording medium having functions that are the same as those of the respective processing units of the control unit 10 illustrated in FIG. 6. Or, the hard disk device 508 stores therein a computer-readable recording medium having functions that are the same as those of the respective processing units of the control unit 110 illustrated in FIG. 5. Further, the hard disk device 508 stores therein various data for realizing the computer-readable recording medium.

By reading out each program stored in the hard disk device 508, expanding it into the RAM 507, and executing it, the CPU 501 executes various types of processing. These programs are able to cause the computer 500 to function as the control unit 10 illustrated in FIG. 6. Or, these programs are able to cause the computer 500 to function as the control unit 110 illustrated in FIG. 5.

The above mentioned computer-readable recording medium does not need to be stored in the hard disk device 508. For example, a program stored in a storage medium that is readable by the computer 500 may be read out and executed by the computer 500. The recording medium readable by the computer 500 corresponds to, for example: a portable recording medium, such as a CD-ROM, a DVD disk, or a universal serial bus (USB) memory; a semiconductor memory, such as a flash memory; or a hard disk drive. Further, this program may be stored in a device connected to a public line, the Internet, a local area network (LAN), or the like, and the computer 500 may be caused to read and execute the program therefrom.

According to one aspect, as compared with a case where conversion is conducted after collective decoding, waste in a storage area used in decoding processing and character code conversion processing or reduction in efficiency is able to be suppressed. Further, as compared with the case where conversion is conducted after collective decoding, a processing time for the decoding processing and character code conversion processing is able to be shortened.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A decoding method comprising:
   decoding first coded data included in a coded data into first partial data, the coded data being encoded from first data with a first character code, by a processor;
   detecting character boundary in the first partial data based on character code information that the coded data is encoded from the first data with the first character code, by the processor; and
   converting at least a part of the first partial data into second data with a second character code utilizing the detected character boundary, based on information associating the first character code with the second character code, by the processor.

2. The decoding method according to claim 1, wherein
   the decoding includes decoding the first coded data into partial data representing a byte string of a particular group that becomes a longest match by using a slide window and accumulating the decoded partial data in a storage area, by the processor,
   the detecting includes determining, at a timing of the decoding of the first coded data, whether or not the character boundary is detected in the partial data accumulated in the storage area, by the processor, and
   the converting includes converting, when the character boundary is determined to be detected in the partial data accumulated in the storage area, data of the unit delimited by the detected character boundary into data of the second character code, by the processor.

3. The decoding method according to claim 2, wherein
   the detecting includes obtaining, based on correspondence between a character code of a head byte of a character and a character length indicating a length of a character code of a character, a character length corresponding to a character code of a head byte of the partial data accumulated in the storage area, and determining whether or not a length of the partial data accumulated in the storage area is equal to or greater than the obtained character length, by the processor, and
   the converting includes converting, when the length of the partial data accumulated in the storage area is determined to be equal to or greater than the obtained character length at the detecting, data corresponding to the character length from a head of the partial data accumulated in the storage area into data of the second character code, by the processor.

4. The decoding method according to claim 3, wherein the converting includes converting, the data corresponding to the character length from the head of the partial data accumulated in the storage area into the data of the second character code, and shifting the data corresponding to the character length in a direction to delete the data, by the processor.

5. The decoding method according to claim 3, wherein the converting includes selecting, from a plurality of pieces of conversion information, which are pieces of conversion information associating, per character, data of character codes of a conversion source and data of character codes of a conversion destination and which are in pairs of the character codes of the conversion source and the character codes of the conversion destination, conversion information according to a character code of the conversion source and a character code of the conversion destination, and converting, by using the selected conversion information, the data corresponding to the character length from the head of the partial data accumulated in the storage area into the data of the character code of the conversion destination, by the processor.

6. A decoding apparatus comprising:
   a processor that executes a process including:
     decoding first coded data included in a coded data into first partial data, the coded data being encoded from first data with a first character code;
     detecting character boundary in the first partial data based on character code information that the coded data is encoded from the first data with the first character code; and
     converting at least a part of the first partial data into second data with a second character code utilizing the detected character boundary, based on information associating the first character code with the second character code.

7. A non-transitory computer-readable recording medium storing therein a decoding program that causes a computer to execute a process comprising:
   decoding first coded data included in a coded data into first partial data, the coded data being encoded from first data with a first character code;
   detecting character boundary in the first partial data based on character code information that the coded data is encoded from the first data with the first character code; and
   converting at least a part of the first partial data into second data with a second character code utilizing the detected character boundary, based on information associating the first character code with the second character code.

8. The decoding method according to claim 1, wherein
   the coded data is encoded utilizing LZ77 compression algorithm.

9. The decoding apparatus according to claim 6, wherein
   the coded data is encoded utilizing LZ77 compression algorithm.

10. The non-transitory computer-readable recording medium according to claim 7, wherein
    the decoding includes decoding the first coded data into partial data representing a byte string of a particular group that becomes a longest match by using a slide window and accumulating the decoded partial data in a storage area,
    the detecting includes determining, at a timing of the decoding of the first coded data, whether or not the character boundary is detected in the partial data accumulated in the storage area, and
    the converting includes converting, when the character boundary is determined to be detected in the partial data accumulated in the storage area, data of the unit delimited by the detected character boundary into data of the second character code.

11. The non-transitory computer-readable recording medium according to claim 10, wherein
the detecting includes obtaining, based on correspondence between a character code of a head byte of a character and a character length indicating a length of a character code of a character, a character length corresponding to a character code of a head byte of the partial data accumulated in the storage area, and determining whether or not a length of the partial data accumulated in the storage area is equal to or greater than the obtained character length, and
the converting includes converting, when the length of the partial data accumulated in the storage area is determined to be equal to or greater than the obtained character length at the detecting, data corresponding to the character length from a head of the partial data accumulated in the storage area into data of the second character code.

12. The non-transitory computer-readable recording medium according to claim 11, wherein the converting includes converting the data corresponding to the character length from the head of the partial data accumulated in the storage area into the data of the second character code, and shifting the data corresponding to the character length in a direction to delete the data.

13. The non-transitory computer-readable recording medium according to claim 11, wherein the converting includes selecting, from a plurality of pieces of conversion information, which are pieces of conversion information associating, per character, data of character codes of a conversion source and data of character codes of a conversion destination and which are in pairs of the character codes of the conversion source and the character codes of the conversion destination, conversion information according to a character code of the conversion source and a character code of the conversion destination, and converting, by using the selected conversion information, the data corresponding to the character length from the head of the partial data accumulated in the storage area into the data of the character code of the conversion destination.

14. The non-transitory computer-readable recording medium according to claim 7, wherein
the coded data is encoded utilizing LZ77 compression algorithm.

* * * * *